(12) United States Patent
Yoshimoto

(10) Patent No.: US 7,307,283 B2
(45) Date of Patent: Dec. 11, 2007

(54) SEMICONDUCTOR DEVICE AND METHOD OF MANUFACTURING THE SAME

(75) Inventor: Satoshi Yoshimoto, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 111 days.

(21) Appl. No.: 11/030,153

(22) Filed: Jan. 7, 2005

(65) Prior Publication Data

US 2005/0116229 A1    Jun. 2, 2005

Related U.S. Application Data

(62) Division of application No. 09/879,090, filed on Jun. 13, 2001, now Pat. No. 7,078,321.

(51) Int. Cl.
*H01L 29/04* (2006.01)
*H01L 29/15* (2006.01)
*H01L 31/036* (2006.01)

(52) U.S. Cl. ............... 257/72; 257/66; 257/E29.117

(58) Field of Classification Search ............... None
See application file for complete search history.

(56) References Cited

U.S. PATENT DOCUMENTS

| | | | |
|---|---|---|---|
| 4,020,319 | A | 4/1977 | Shepard et al. |
| 4,069,080 | A | 1/1978 | Osborne |
| 4,234,356 | A | 11/1980 | Auston et al. |
| 4,422,090 | A | 12/1983 | Shepherd et al. |
| 4,599,133 | A | 7/1986 | Miyao et al. |
| 4,609,407 | A | 9/1986 | Masao et al. |
| 4,659,422 | A | 4/1987 | Sakurai |
| 4,925,273 | A | 5/1990 | Maisenbacher et al. |
| 5,056,099 | A | 10/1991 | Bradley |

(Continued)

FOREIGN PATENT DOCUMENTS

| | | |
|---|---|---|
| JP | 56-064480 | 6/1981 |
| JP | 58-218169 | 12/1983 |
| JP | 06-005862 | 1/1994 |
| JP | 07-130652 | 5/1995 |

(Continued)

OTHER PUBLICATIONS

Im et al., *Phase Transformation Mechanisms Involved in Excimer Laser Crystallization of Amorphous Silicon Films*, Appl. Phys. Lett. 63(14), pp. 1969-1971, Oct. 4, 1993.

(Continued)

*Primary Examiner*—Evan Pert
*Assistant Examiner*—Benjamin P. Sandvik
(74) *Attorney, Agent, or Firm*—Eric J. Robinson; Robinson Intellectual Property Law Office, P.C.

(57) ABSTRACT

A crystalline semiconductor film in which the position and the size of crystal grains are controlled is provided, and a TFT that can operate at high speed is obtained by forming a channel formation region of the TFT from the crystalline semiconductor film. A heat retaining film is formed on an insulating surface, a semiconductor film is formed to cover the heat retaining film, and a reflective film is formed to partially cover the semiconductor film. The reflective films and the semiconductor film are irradiated with a laser beam. The reflective film creates a distribution in effective irradiation intensity of laser beam on the semiconductor film. The distribution, with the heat retaining effect provided by the heat retaining film, generates a temperature gradient in the semiconductor film. Utilizing these, the position where crystal nuclei are to be generated and the direction in which crystal growth should advance can be controlled and crystal grains having a large grain size can be obtained.

15 Claims, 16 Drawing Sheets

U.S. PATENT DOCUMENTS

| | | | |
|---|---|---|---|
| 5,219,786 A | 6/1993 | Noguchi | |
| 5,247,190 A | 9/1993 | Friend et al. | |
| 5,264,072 A | 11/1993 | Mukai | |
| 5,304,829 A | 4/1994 | Mori et al. | |
| 5,399,502 A | 3/1995 | Friend et al. | |
| 5,426,315 A | 6/1995 | Pfiester | |
| 5,432,122 A | 7/1995 | Chae | |
| 5,543,352 A | 8/1996 | Ohtani et al. | |
| 5,561,081 A | 10/1996 | Takenouchi et al. | |
| 5,583,366 A | 12/1996 | Nakazawa | |
| 5,594,569 A | 1/1997 | Konuma et al. | |
| 5,612,250 A | 3/1997 | Ohtani et al. | |
| 5,612,251 A | 3/1997 | Lee | |
| 5,643,801 A | 7/1997 | Ishihara et al. | |
| 5,643,826 A | 7/1997 | Ohtani et al. | |
| 5,744,824 A | 4/1998 | Kousai et al. | |
| 5,767,003 A | 6/1998 | Noguchi | |
| 5,811,322 A | 9/1998 | Robinson | |
| 5,817,548 A | 10/1998 | Noguchi et al. | |
| 5,841,197 A | 11/1998 | Adamic, Jr. | |
| 5,854,803 A | 12/1998 | Yamazaki et al. | |
| 5,882,960 A | 3/1999 | Zhang et al. | |
| 5,893,730 A | 4/1999 | Yamazaki et al. | |
| 5,895,933 A | 4/1999 | Zhang et al. | |
| 5,897,799 A | 4/1999 | Yamazaki et al. | |
| 5,900,980 A | 5/1999 | Yamazaki et al. | |
| 5,910,262 A | 6/1999 | Baumgart et al. | |
| 5,923,962 A | 7/1999 | Ohtani et al. | |
| 5,952,058 A | 9/1999 | Xuan | |
| 5,953,597 A | 9/1999 | Kusumoto et al. | |
| 5,959,779 A | 9/1999 | Yamazaki et al. | |
| 5,960,323 A | 9/1999 | Wakita et al. | |
| 5,968,383 A | 10/1999 | Yamazaki et al. | |
| 5,972,742 A | 10/1999 | Zhang et al. | |
| 5,986,306 A | 11/1999 | Nakajima et al. | |
| 5,989,945 A * | 11/1999 | Yudasaka et al. | 438/149 |
| 6,002,101 A | 12/1999 | Yamazaki et al. | |
| 6,002,523 A | 12/1999 | Tanaka | |
| 6,020,045 A | 2/2000 | Chen et al. | |
| 6,020,224 A | 2/2000 | Shimogaichi et al. | |
| 6,038,075 A | 3/2000 | Yamazaki et al. | |
| 6,043,512 A | 3/2000 | Adachi | |
| 6,051,453 A | 4/2000 | Takemura | |
| 6,054,206 A * | 4/2000 | Mountsier | 428/315.8 |
| 6,066,516 A | 5/2000 | Miyasaka | |
| 6,078,070 A | 6/2000 | Robinson | |
| 6,087,625 A | 7/2000 | Iso | |
| 6,088,379 A | 7/2000 | Owa et al. | |
| 6,091,047 A | 7/2000 | Miyakawa et al. | |
| 6,107,107 A | 8/2000 | Bruce et al. | |
| 6,108,464 A | 8/2000 | Foresi et al. | |
| 6,133,076 A | 10/2000 | Yamazaki et al. | |
| 6,171,890 B1 | 1/2001 | Adachi et al. | |
| 6,190,949 B1 | 2/2001 | Noguchi et al. | |
| 6,210,996 B1 | 4/2001 | Yamazaki et al. | |
| 6,215,154 B1 | 4/2001 | Ishida et al. | |
| 6,218,260 B1 | 4/2001 | Lee et al. | |
| 6,245,602 B1 | 6/2001 | Ho et al. | |
| 6,246,524 B1 | 6/2001 | Tanaka | |
| 6,248,606 B1 | 6/2001 | Ino et al. | |
| 6,266,167 B1 | 7/2001 | Klug et al. | |
| 6,274,462 B1 | 8/2001 | Fiorini et al. | |
| 6,277,679 B1 | 8/2001 | Ohtani | |
| 6,285,042 B1 | 9/2001 | Ohtani et al. | |
| 6,300,176 B1 | 10/2001 | Zhang et al. | |
| 6,310,362 B1 | 10/2001 | Takemura | |
| 6,322,625 B2 | 11/2001 | Im | |
| 6,335,541 B1 | 1/2002 | Ohtani et al. | |
| 6,337,109 B1 | 1/2002 | Yamazaki et al. | |
| 6,346,438 B1 | 2/2002 | Yagishita et al. | |
| 6,358,766 B1 | 3/2002 | Kasahara | |
| 6,365,933 B1 | 4/2002 | Yamazaki et al. | |
| 6,380,009 B1 | 4/2002 | Battersby | |
| 6,380,044 B1 | 4/2002 | Talwar et al. | |
| 6,410,368 B1 | 6/2002 | Kawasaki et al. | |
| 6,426,245 B1 | 7/2002 | Kawasaki et al. | |
| 6,452,213 B1 * | 9/2002 | Kimura et al. | 257/66 |
| 6,479,333 B1 | 11/2002 | Takano et al. | |
| 6,489,222 B2 | 12/2002 | Yoshimoto | |
| 6,492,659 B1 | 12/2002 | Yamazaki et al. | |
| 6,524,877 B1 | 2/2003 | Nakazawa et al. | |
| 6,548,370 B1 | 4/2003 | Kasahara et al. | |
| 6,555,875 B2 | 4/2003 | Kawasaki et al. | |
| 6,559,036 B1 | 5/2003 | Ohtani et al. | |
| 6,590,230 B1 | 7/2003 | Yamazaki et al. | |
| 6,599,788 B1 | 7/2003 | Kawasaki et al. | |
| 6,608,357 B1 | 8/2003 | Yamazaki et al. | |
| 6,624,013 B2 | 9/2003 | Kawasaki et al. | |
| 6,653,657 B2 | 11/2003 | Kawasaki et al. | |
| 6,730,550 B1 | 5/2004 | Yamazaki et al. | |
| 6,744,008 B1 | 6/2004 | Kasahara et al. | |
| 6,762,081 B2 | 7/2004 | Yamazaki et al. | |
| 2003/0132435 A1 | 7/2003 | Nakazawa et al. | |
| 2003/0203656 A1 | 10/2003 | Kasahara et al. | |
| 2004/0092061 A1 | 5/2004 | Kawasaki et al. | |
| 2004/0140470 A1 | 7/2004 | Kawasaki et al. | |

FOREIGN PATENT DOCUMENTS

| | | |
|---|---|---|
| JP | 07-131034 | 5/1995 |
| JP | 07-161634 | 6/1995 |
| JP | 07-321339 | 12/1995 |
| JP | 08-228006 | 9/1996 |
| JP | 09-186336 | 7/1997 |
| JP | 09-260676 | 10/1997 |
| JP | 09-283443 | 10/1997 |
| JP | 10-092576 | 4/1998 |
| JP | 10-135468 | 5/1998 |
| JP | 10-135469 | 5/1998 |
| JP | 10-247735 | 9/1998 |
| JP | 11-219133 | 8/1999 |
| JP | 2000-150412 | 5/2000 |
| JP | 2001-203360 | 7/2001 |
| WO | WO 90/13148 | 11/1990 |

OTHER PUBLICATIONS

Baker, Jr., et al., *Field Effect Transistor*, IBM Technical Disclosure Bulletin, vol. 11, No. 7, p. 849, Dec. 1, 1968.

Helen et al., *Reproducible High Field Effect Mobility Polysilicon Thin Film Transistors Involving Pulsed Nd:YVO$_4$ Laser Crystallization*, IEDM 99, pp. 297-300.

Inui et al., *Thresholdless Antiferroelectricity in Liquid Crystals and its Application to Displays*, J. Mater. Chem., vol. 6, No. 4, pp. 671-673, Jan. 1, 1996.

Aragona, *Dislocation Etch for (100) Planes of Silicon*, J. Electrochem. Soc., vol. 119, No. 7, pp. 948-951, Jul.1, 1972.

Terada et al., *Half-V Switching Mode FLCD*, Proceedings of 46th Applied Physics Association Lectures, 28P-V-8/p. 1316.

Yoshida et al., *33.2: A Full-Color Thresholdless Antiferroelectric LCD Exhibiting Wide Viewing Angle With Fast Response Time*, SID 97 Digest, pp. 841-844, Jan. 1, 1997.

Furue et al., *P-78: Characteristics and Driving Scheme of Polymer-Stabilized Monostable FLCD Exhibitting Fast Response Time and High Contrast Ratio with Gray-Scale Capability*, SID 98 Digest, pp. 782-785, Jan. 1, 1998.

Yoshimoto et al., "Excimer-Laser-Produced and Two-Dimensionally Position-Controlled Giant Si Grains on Organic SOG Underlayer," pp. 285-286, Jul. 12-14, 2000, Digest of Technical Papers, AM-LCD 2000, International Workshop on Active-Matrix Liquid-Crystal Displays.

Ishihara et al., "Location-Controlled Adjacent Grains Following Excimer-Laser Melting of Si Thin-Films," pp. 153-156, 1998, AM-LCD, TFTP1-3.

Ishihara et al., "Location-Control of Large Grain Following Excimer-Laser Melting of Si Thin-Flims," pp. 1071-1075, Mar. 1998, Jpn J. Appl. Phys. vol. 37, No. 3B.

Mariucci et al., "Lateral Growth Control in Excimer Laser Crystallized Polysilicon," pp. 137-142, 1999, Thin Solid Films, 337.

Schenk et al., "Polymers for Light Emitting Diodes," pp. 33-37, Sep. 6-9, 1999, Euro Display '99, The 19th International Display Research Conference.

Shimizu et al., "High-Mobility Poly-Si Thin-Film Transistors Fabricated by a Novel Excimer Laser Crystallization Method," pp. 112-117, Jan. 1993, IEEE, Transactions on Electron Devices, vol. 40, No. 1.

* cited by examiner

Fig. 1A
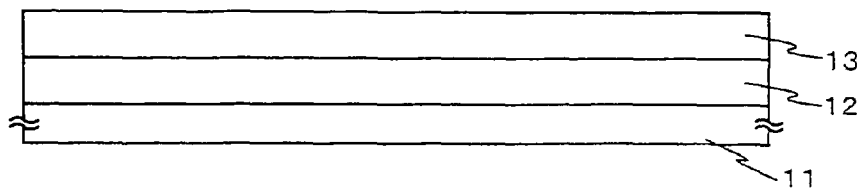
Fig. 1B
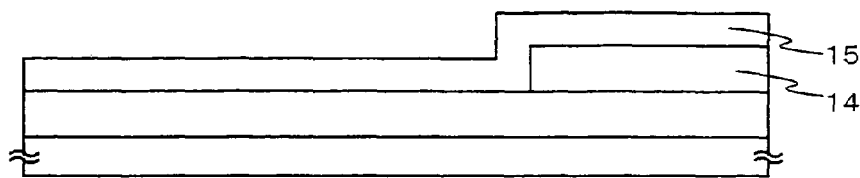
Fig. 1C
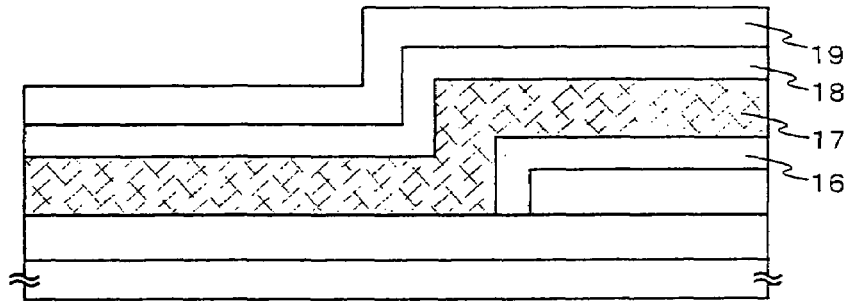
a cross sectional view
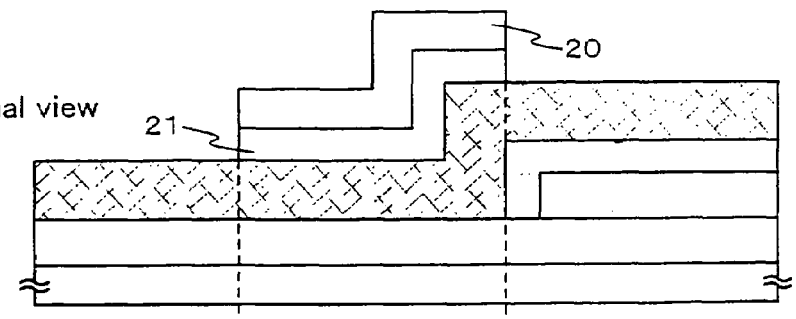
a top view
Fig. 1D
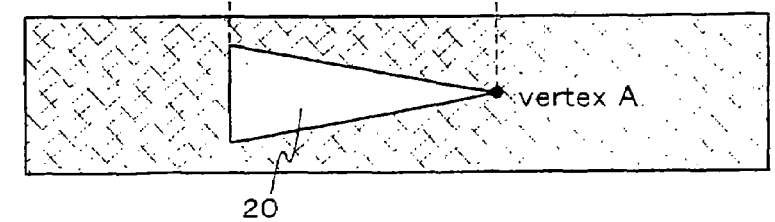

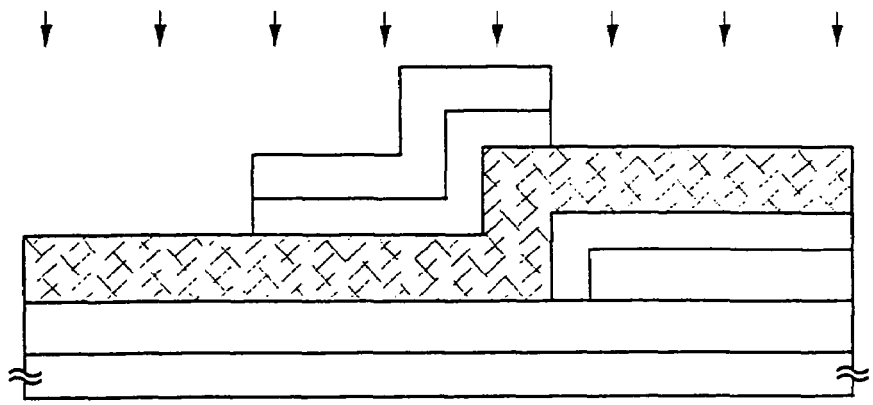
Fig 2A
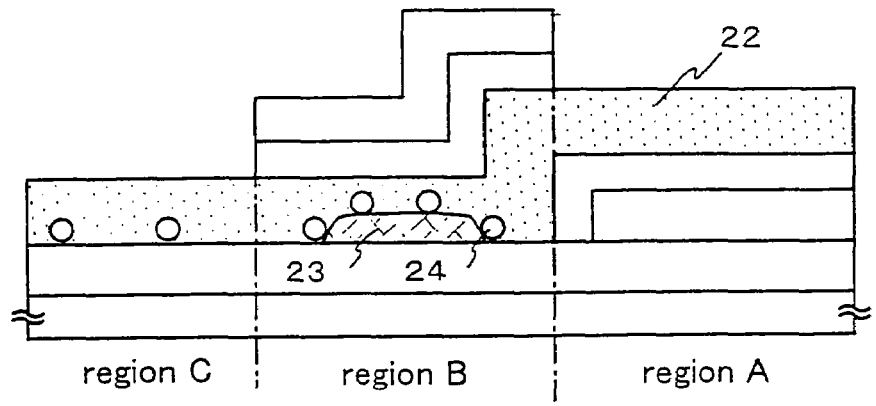
Fig. 2B
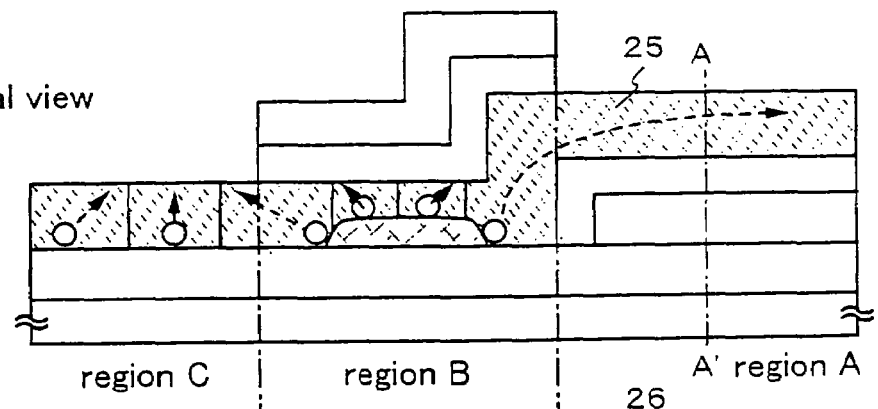
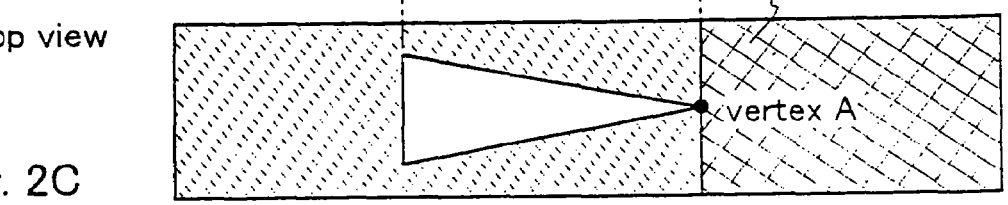
Fig. 2C

Fig. 6A
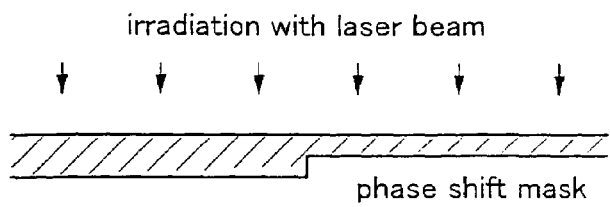
Fig. 6B
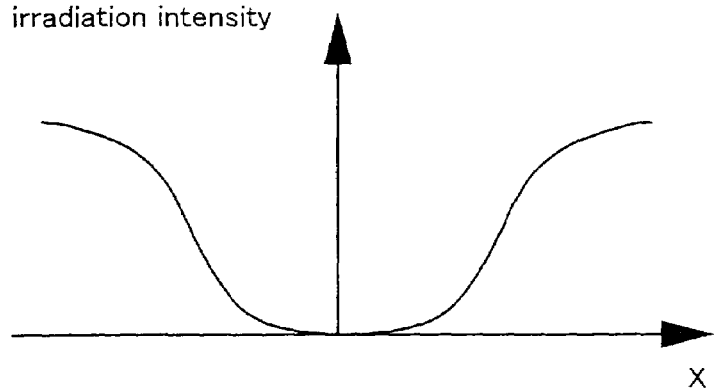
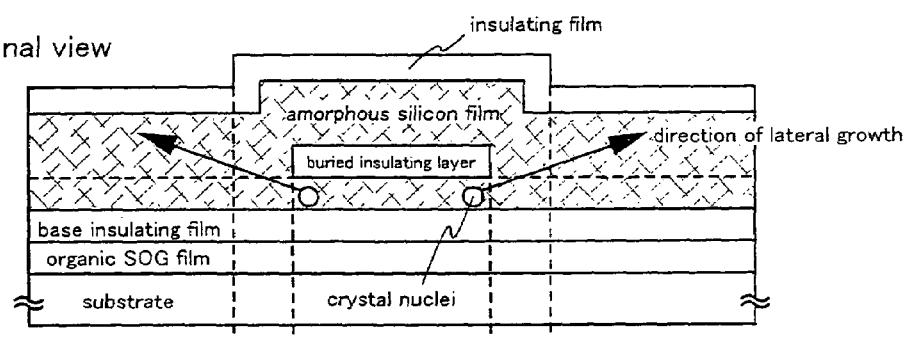
Fig. 6C
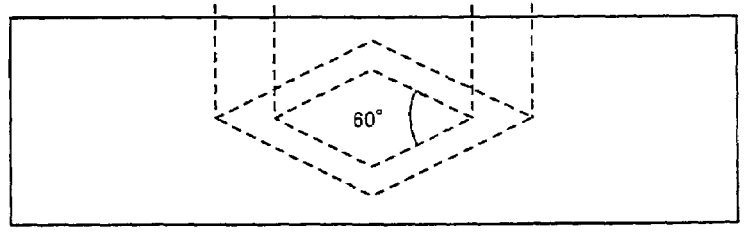

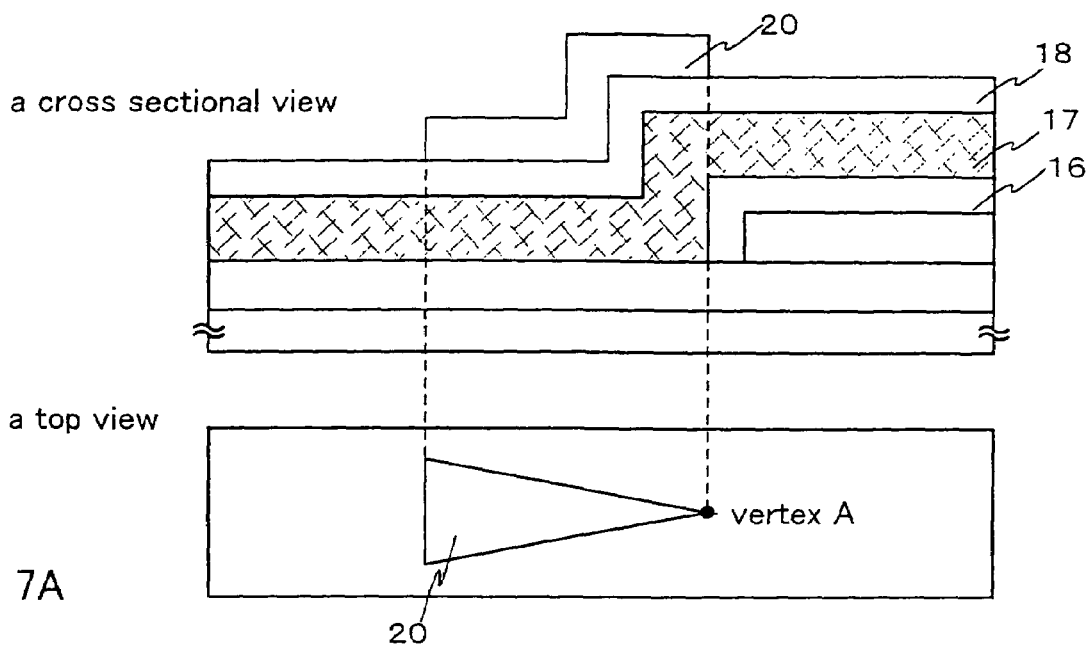
Fig. 7A
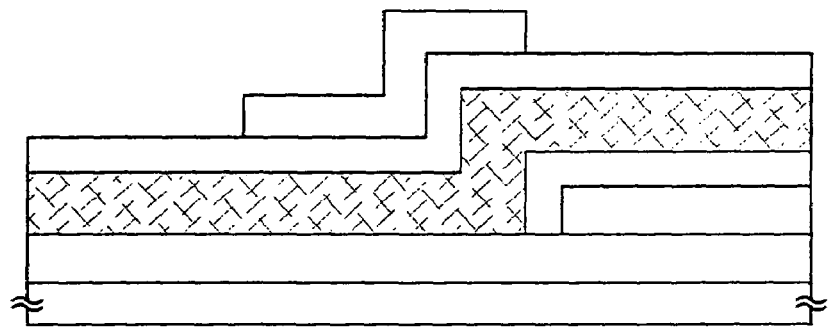
Fig. 7B

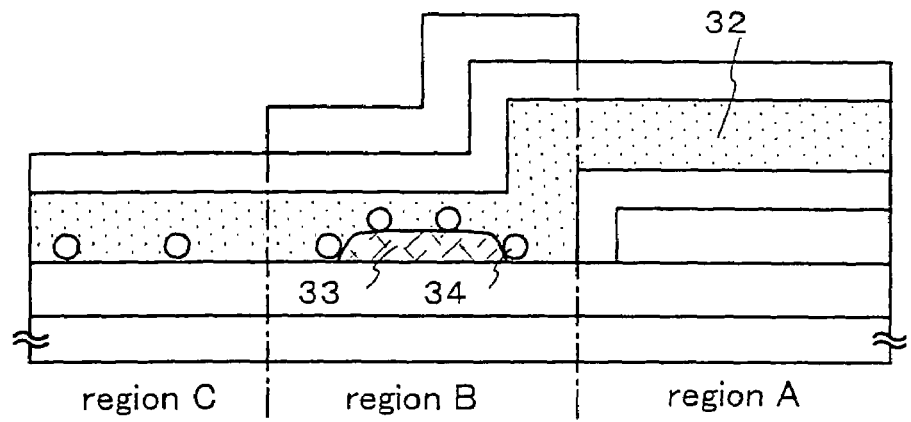
Fig. 8A
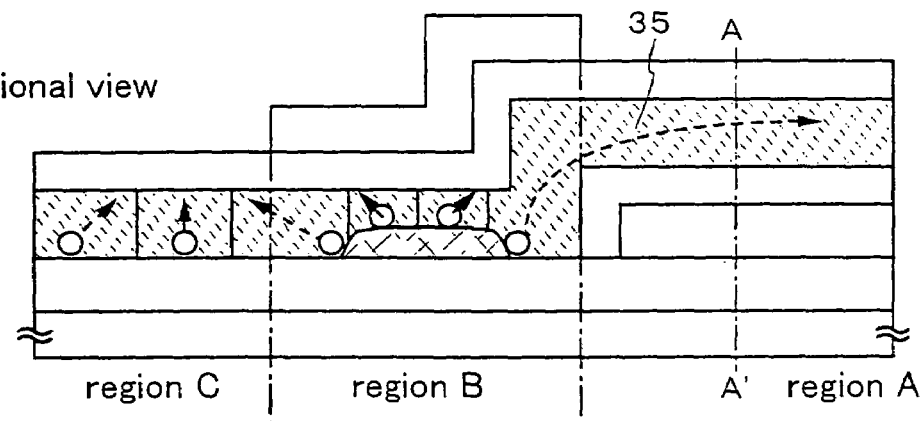
a cross sectional view
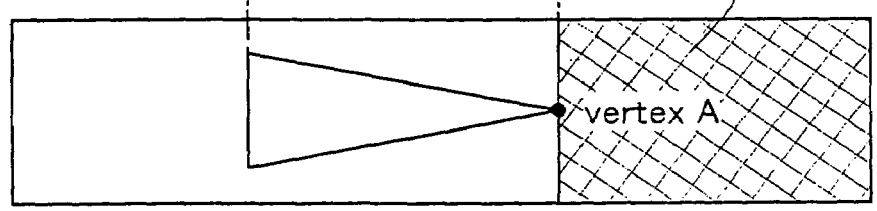
a top view
Fig. 8B

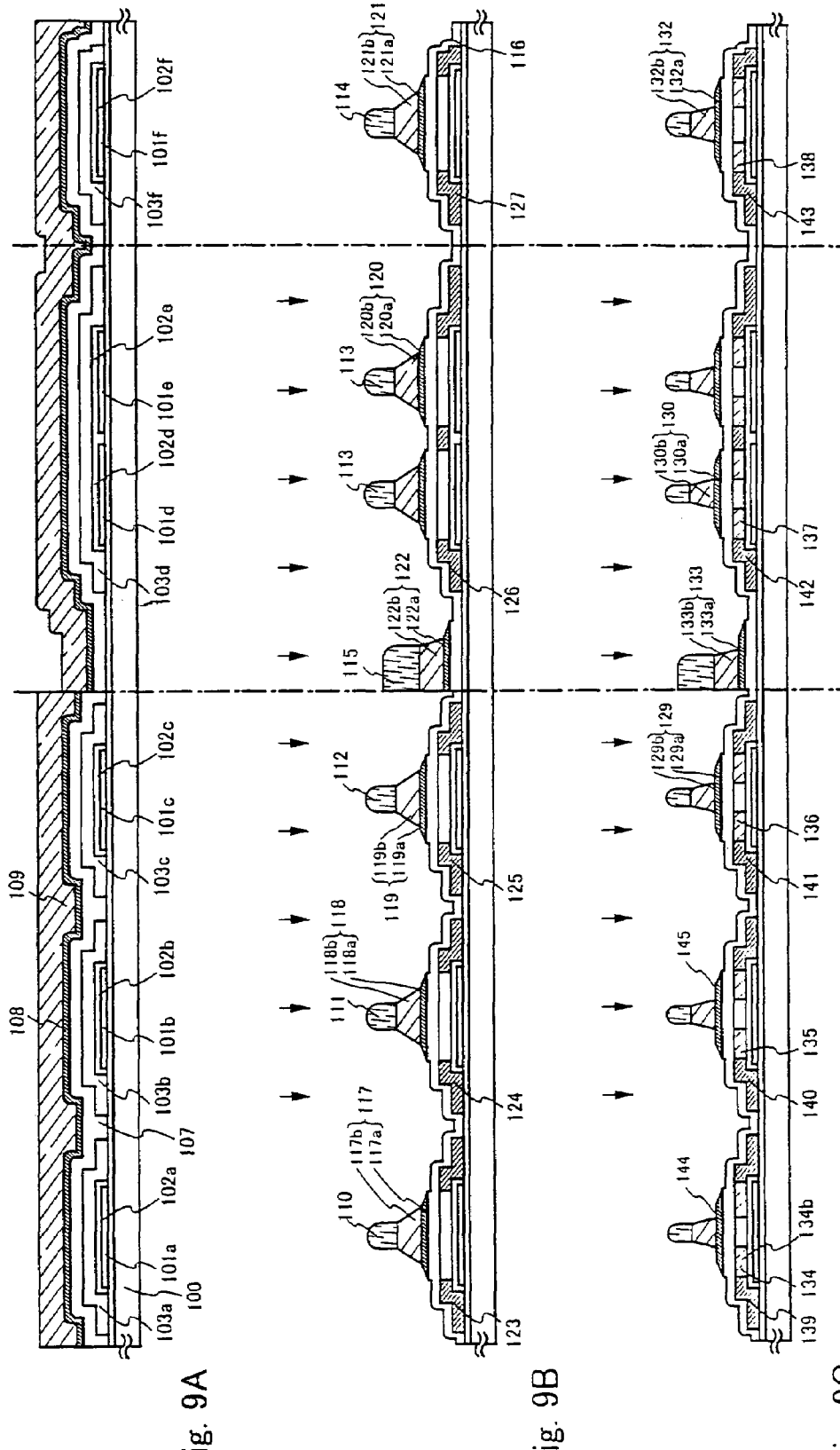

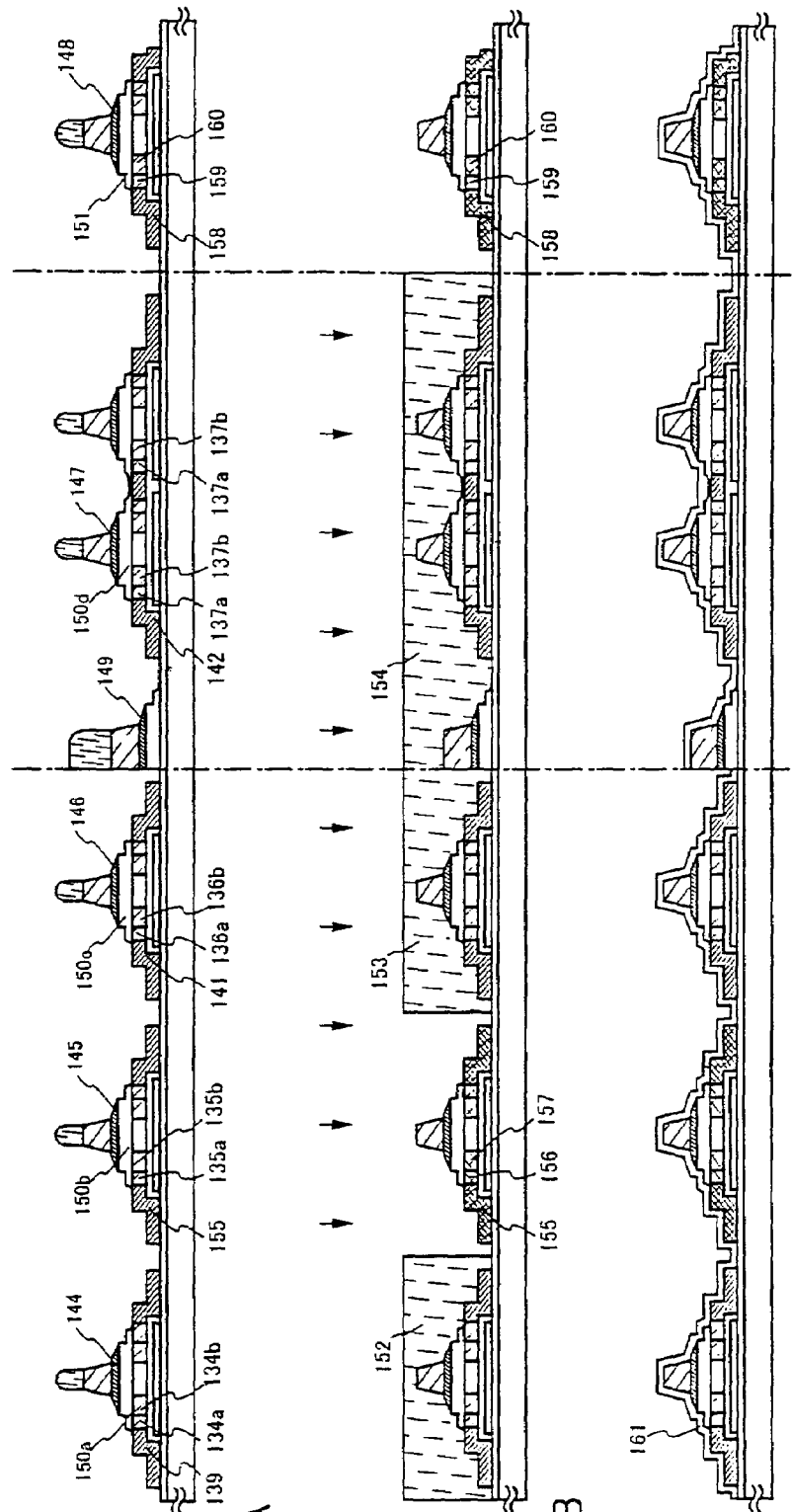

SEMICONDUCTOR DEVICE AND METHOD OF MANUFACTURING THE SAME

BACKGROUND OF THE INVENTION

1. Field of the Invention

The present invention relates to a method of manufacturing a semiconductor device having circuits that are composed of thin film transistors (hereinafter referred to as TFTs). Specifically, the invention relates to the structure of electro-optical devices represented by liquid crystal display devices and of electric appliances having as their parts the electro-optical devices, and the invention also relates to how to manufacture the devices. The term semiconductor device herein refers to a device in general which utilizes semiconductor characteristics to function, and the electro-optical devices and electric appliances described above fall within this category.

2. Description of the Related Art

A technique that has been a popular research subject in recent years is to use laser annealing to crystallize an amorphous semiconductor film formed on an insulating substrate such as a glass substrate or to improve crystallinity of a crystallized film. The amorphous semiconductor film is often formed from silicon.

A glass substrate has advantages over a synthesized quartz glass substrate often used in the past, for it is inexpensive, is readily processible, and easily allows a large surface area to be obtained. These are the reasons for the flood of researches mentioned above. Laser annealing is preferred in crystallizing a film on a glass substrate because glass substrates have low melting point. A laser can give high energy only to an amorphous semiconductor film without increasing the temperature of the glass substrate on which the film is formed much.

A crystalline semiconductor is composed of many crystal grains and hence also called a polycrystalline semiconductor. A semiconductor film having crystal grains whose grain size is larger than the grain size of crystal grains of a semiconductor film is called a crystalline semiconductor film. A crystalline semiconductor film formed by laser annealing has high mobility. Therefore TFTs formed from crystalline semiconductor films are frequently used in, for example, a monolithic liquid crystal electro-optical device in which pixel TFTs and driver circuit TFTs are formed on the same glass substrate.

An annealing method that is highly productive and industrially superior and hence is widely employed includes: choosing a high power pulse laser such as an excimer laser; processing the pulse laser beam by an optical system into a spot beam that forms a few centimeter square on an irradiation surface, or into a linear beam extending 10 centimeters or longer on the irradiation surface; and performing scanning with the processed laser beam over the irradiation surface (or moving the laser beam irradiation position relative to the irradiation surface).

The linear laser beam is particularly productive, for laser irradiation of the entire irradiation surface can be done by running the linear beam only in the direction perpendicular to the longitudinal direction of the linear beams, unlike the spot-like laser beam that has to be used for scanning in both longitudinal and lateral directions. The linear laser beam is run in the direction perpendicular to the longitudinal direction because it is the most efficient scanning direction. Owing to this high productivity, laser annealing that uses a linear beam obtained by processing a pulse oscillation excimer laser beam through an appropriate optical system is becoming a mainstream technique for manufacturing a liquid crystal display device or the like from TFTs. This technique has made a monolithic liquid crystal display device reality in which TFTs for forming a pixel portion (pixel TFTs) and TFTs for forming driver circuits to be provided in the periphery of the pixel portion are formed on the same glass substrate.

However, in a crystalline semiconductor film formed by laser annealing, plural crystal grains mass, so that the crystal grains with irregular grain sizes are distributed unevenly. In a TFT formed on a glass substrate, its crystalline semiconductor film is divided into island-like patterns in order to separate elements. With crystal grains of irregular grain sizes distributed unevenly, it is impossible to specify the position and the size of the crystal grains in forming a TFT. There are much more recombination centers and trap centers due to the amorphous structure or crystal defects in the interface between crystal grains (crystal grain boundary) than inside the crystal grains. It is known that if carriers are trapped in these trap centers, the potential in the crystal grain boundary is raised to block the carriers and degrade the current transportation characteristic of the carriers. While electric characteristics of a TFT heavily depend on the crystallinity of the semiconductor film for forming a channel formation region; it has been almost impossible to remove the adverse effects of crystal grain boundary and form the channel formation region from a single crystal semiconductor film.

In order to solve those problems, various attempts have been made to control the position of crystal grains and increase the grain size by laser annealing. Now, a process a semiconductor film takes to solidify after the semiconductor film is irradiated with a laser beam is described first.

It takes a while for the semiconductor film that has been thoroughly melted by laser beam irradiation to form crystal nuclei. When an infinite number of crystal nuclei are evenly (or unevenly) generated in a thoroughly melted region and grow into crystals, the solidification process is completed for the thoroughly melted semiconductor film. The crystal grains obtained through this are distributed unevenly and have irregular grain sizes.

If the laser beam irradiation fails to melt the semiconductor film thoroughly and a solid phase semiconductor region partially remains, crystal growth is started immediately after the laser beam irradiation from the solid phase semiconductor regions. As mentioned before, it takes a while for the thoroughly melted region to generate crystal nuclei. Therefore, until crystal nuclei are generated in the thoroughly melted region, solid-liquid interface (meaning the border between the solid phase semiconductor region and the thoroughly melted region) that is the crystal growth front moves in a direction parallel to the surface of the semiconductor film (hereinafter referred to as lateral direction). This causes crystal grains to grow to gain a length several tens longer than the thickness of the semiconductor film. Such growth is ended when an infinite number of crystal nuclei are evenly (or unevenly) generated and grow into crystals in the thoroughly melted region. This phenomenon will hereinafter be called a super lateral growth.

An amorphous semiconductor film and a polycrystalline semiconductor film also have a region in which the energy of the laser beam is high enough to induce the super lateral growth. However, such high energy region is very narrow and where a crystal grain having a large grain size is to be formed cannot be controlled. In addition, regions other than the region in which crystal grains having a large grain size are formed are microcrystalline regions in which an infinite number of crystal nuclei are generated, or amorphous regions.

As described above, the position and the direction of crystal grain growth can be controlled if the temperature gradient in the lateral direction can be controlled (namely, if a heat flow running in the lateral direction can be generated) in the high energy region in which the energy of a laser beam is high enough to melt the semiconductor film thoroughly. Achieving this control has been tackled from various angles.

For example, a method of forming crystal grains at designed positions is described in "Lateral growth control in excimer laser crystallized polysilicon: Thin Solid Films 337 (1999), p 137-p 142). First, a metal film (a single layer of Cr or a laminate film obtained by layering an Al film on a Cr film) is formed on an amorphous semiconductor film and is partially etched to form a metal film region and a metal film less region on the amorphous semiconductor film. The reflectance of Cr when the wavelength is 308 nm is about 60% and the reflectance of Al for the same wavelength is about 90%. Accordingly, in irradiation of laser beam having a wavelength of 308 nm, an amorphous semiconductor region under the metal film is irradiated less than an amorphous semiconductor region that is not covered with the metal film. In other words, there is a temperature gradient between the amorphous semiconductor region under the metal film and the amorphous semiconductor region that is not covered with the metal film. Therefore crystal nuclei generated in the amorphous semiconductor region under the metal film grow laterally toward the amorphous semiconductor region that is not covered with the metal film and that remains melted. According to the report, crystal grains having a grain size of 1 to 2 μm are formed through the lateral growth.

Masakiyo Matsumura of Tokyo Institute of Technology, et al. made a presentation at the forty-seventh meeting of The Japan Society of Applied Physics and Related Societies about a method of forming a crystal grain having a large grain size at a designed position. According to the method, an organic SOG film is formed on a glass substrate and a silicon oxide film is formed on the organic SOG film. On the silicon oxide film, an amorphous silicon film is formed to bury an insulating layer (buried insulating layer) in the amorphous silicon film (FIG. 6C). The buried insulating layer is quadrangular in top view and at least one vertex of the quadrangle is 60°.

The silicon oxide film and the glass substrate form a random network of Si—O bonds. Accordingly, when the silicon oxide film is formed on the glass substrate and the silicon oxide film is irradiated with a laser beam, the energy given by the laser beam irradiation is easily transmitted to the glass substrate. However, if the silicon oxide film has a carbon-containing functional group (a silicon oxide film having a carbon-containing functional group is referred to as functional group containing silicon oxide film in this specification), the functional group terminates the bond and inhibits the film from participating in forming the network of Si—O bonds. A functional group containing silicon oxide film formed on a substrate thus has low heat transmission rate, effectively working as a heat retaining film. In this specification, having a heat transmission rate lower than that of the silicon oxide film and of the glass substrate is equal to having a heat retaining effect, and a film having the heat retaining effect is called a heat retaining film. A high heat transmission rate herein means a high heat conductivity whereas a low heat transmission rate means a low heat conductivity. In irradiating the silicon oxide film with a laser beam, a phase shift mask (FIG. 6A) is used to give a gradient in energy of the laser beam (FIG. 6B). Allegedly, the method thus form crystal grains having a large grain size at designed positions.

An article by R. Ishihara and A. Burtsev, published in AM-LCD '98, p 153-p 156, 1998, reports a laser annealing method in which a high melting point metal film is formed between a substrate and a silicon oxide film serving as a base film, an amorphous silicon film is formed above where the high melting point metal film is formed, and the substrate is irradiated with an excimer laser beam from both the front and back (the front side of a substrate is herein defined as a surface on which films are formed and the back side thereof is defined as a surface opposite to the surface on which films are formed). A laser beam applied to the front side of the substrate is absorbed by the silicon film and changed into heat. On the other hand, a laser applied to the back side of the substrate is absorbed by the high melting point metal film and changed into heat, thereby heating the high melting point metal film to a high temperature. The silicon oxide film provided between the heated high melting point metal film and the silicon film serves as a heat accumulating layer, so that the melted silicon film cools slowly. According to the report, a large crystal grain with the maximum diameter being 6.4 μm can be formed in an arbitrary place by forming the high melting point metal film in an arbitrary place.

A method called sequential lateral solidification method (the SLS method) has been developed by James S. Im of Columbia University, et al. to induce super lateral growth in a desired place. In the SLS method, a mask having a slit is moved along for every shot by a distance corresponding to the length of super lateral growth (about 0.75 μm) to crystallize the film.

The method in which a metal film is partially formed on an amorphous semiconductor film by laser beam irradiation for crystallization has drawbacks. Crystal grains obtained by this method have a small grain size of 1 to 2 μm. Also, the method can control where the crystal grains are to be formed but it cannot control the formation position on a single crystal basis. The metal film that is formed directly on the amorphous semiconductor film also can cause a problem, in that the metal elements in the film diffuse into the amorphous semiconductor film. If this amorphous semiconductor film with the diffused metal elements is crystallized to form a crystalline semiconductor film and the crystalline semiconductor film is used to form a TFT, the TFT may have degraded electric characteristics. Furthermore, the method may cause cracking or peeling in the metal film and the amorphous semiconductor film.

In the method disclosed by Matsumura et al., the phase shift mask is necessary to give gradient to laser beam energy. In order to position the phase shift mask relative to the buried insulating layer, control with a micron-level precision is needed to thereby make the laser irradiation apparatus for this method more complicated than an ordinary laser irradiation apparatus. Also, the buried insulating layer that is quadrangular in top view with one or more corners of the quadrangle having an angle as wide as 60° results in too many crystal nuclei in the semiconductor film below the wide corner or corners when the semiconductor film that has been melted by laser irradiation is cooled down. These crystal grains crowd the film and collide with one another as they grow, thereby lowering possibility of obtaining crystal grains of large grain size. Furthermore, the complicate structure of burying an insulating layer in an amorphous semiconductor film cause the trouble when it comes to forming a TFT. The trouble is that the buried insulating layer remains despite the fact that it has nothing to do with the actual function of the TFT.

The method proposed by R. Ishihara et al. can form a semiconductor film that may be used as an active layer of a top gate TFT structurally. However, this top gate TFT will have difficulty in operating at high speed because the silicon oxide film provided between the amorphous semiconductor film and the high melting point metal film generates parasitic capacitance to increase current consumption. On the other hand, the method will be useful for a bottom gate TFT or a reversed stagger TFT, for the high melting point metal film can serve as a gate electrode. Still, the method requires that a silicon oxide film is formed on a substrate, a high melting point metal film is formed on the silicon oxide film, and an amorphous silicon film is formed above where the high melting point metal film is formed. The thickness thereof, even if not counting the thickness of the semiconductor film in and considering only the thickness of the high melting point metal film and the silicon oxide film, does not amount to a thickness that is suitable both for crystallization process and for a TFT element in terms of electric characteristics. Thus the method cannot satisfy the optimal design for crystallization process and the optimal design for element structure simultaneously.

Moreover, when a high melting point metal film that does not transmit light is formed over the entire surface of a glass substrate, it cannot form a transmissive liquid crystal display device. Also, a chromium (Cr) film or a titanium (Ti) film used as the high melting point metal film has high internal stress, which probably leads to insufficient adhesion to the glass substrate. The high internal stress also influences the semiconductor film to be formed above the high melting point metal film and is likely to cause distortion in the resultant crystalline semiconductor film.

On the other hand, in order to control the threshold voltage (hereinafter referred to as Vth) that is an important parameter in TFTs so that it falls within a given range, charged electrons in a channel formation region has to be controlled. In addition, in order to obtain controlled Vth, it is required that charge defect density is reduced in a base film formed from an insulating film in contact with an active layer as well as in a gate insulating film and that the internal stress in the films is balanced. These requirements are suitably met by a material containing silicon as its ingredient, such as a silicon oxide film or a silicon oxynitride film. Therefore, there is a fear that the high melting point metal film provided between the substrate and the base film will disturb the balance.

The SLS method requires control with a micron-level precision in positioning the mask relative to the substrate, thereby making the laser irradiation apparatus for this method more complicated than an ordinary one. Moreover, the method has a problem in throughput when it is used to form a TFT for a liquid crystal display device having a large area region.

SUMMARY OF THE INVENTION

The present invention has been made to solve those problems and an object of the present invention is therefore to provide a crystalline semiconductor film in which the position and the size of crystal grains are controlled, and to provide a TFT that can operate at high speed by forming a channel formation region of the TFT from the obtained crystalline semiconductor film. Another object of the present invention is to provide a technique of applying the obtained TFT to various semiconductor devices such as a transmissive liquid crystal display device and a display device that uses an electro-luminescence material.

The present invention increases the grain size of crystal grains of a crystalline semiconductor film formed by laser annealing. The invention is characterized in that the cooling process of a semiconductor film is slowed down using a heat retaining film formed between the semiconductor film and a substrate to reduce the heat loss rate of heat given by laser beam irradiation and that a reflective film is formed on a region of the semiconductor film which does not overlap the heat retaining film to create a temperature gradient in the semiconductor film, whereby crystal grains having a large grain size are formed at designed positions. The reflective film in this specification refers to a film having high reflectance. Since crystal growth length is in proportion to the product of growth time (a time period a melted semiconductor film takes to solidify) and growth rate (speed at which the solid-liquid interface moves), the grain size is increased as the cooling rate of the semiconductor film is lowered to prolong the growth time. The position of the crystal grain can also be controlled by controlling the cooling rate.

The heat retaining film is formed using a silicon oxide film that contains methyl ($CH_3$), ethyl ($C_2H_5$), propyl ($C_3H_7$), butyl ($C_4H_9$), vinyl ($C_2H_3$), phenyl ($C_6H_5$), or $CF_3$ group (functional group containing silicon oxide film). A silicon oxide film containing any one of the groups given above does not participate in forming a network of Si—O bonds because the functional group terminates the bonds. The heat transmission rate is thus lowered and the film works effectively as the heat retaining film. It is also effective to use a porous silicon film or a porous silicon oxide film to form the heat retaining film. Owing to the pores, heat transmission rate is low in a porous silicon film or a porous silicon oxide film to make the film useful as the heat retaining film.

When the functional group containing silicon oxide film is used for the heat retaining film, it is desirable to form an insulating film on the functional group containing silicon oxide film in order to prevent diffusion of impurities from the functional group containing silicon oxide film. In the case of using a porous silicon film or a porous silicon oxide film for the heat retaining film also, forming an insulating film on the porous silicon film or the porous silicon oxide film is desirable in order to keep the surface level for the porous silicon film or the porous silicon oxide film.

Described next is a method of varying the effective irradiation intensity of a laser beam on the semiconductor film by forming the reflective film to partially cover the semiconductor film. A distribution in effective irradiation intensity of laser beam can be created if a laser beam irradiates the semiconductor film from the side where the reflective film partially covers the semiconductor film. The description here takes as an example the case where the reflective film is a metal film and the semiconductor film is an amorphous silicon film.

When an amorphous film with a thickness of 55 nm is irradiated with a laser beam, the reflectance varies depending on the wavelength of the laser beam as shown in FIG. 4. When a metal film is irradiated with a laser beam also, the reflectance varies depending on the wavelength of the laser beam as shown in FIG. 5. In order to create a distribution in effective irradiation intensity of laser beam on the semiconductor film by forming a reflective film so as to partially cover the semiconductor film, the reflectance against the reflective film and the reflectance against the semiconductor film have to be the same, at least. Preferably, the reflectance against the reflective films is higher than the reflectance against the semiconductor film. However, note that the optimal condition may differ from mode to mode because the reflectance varies depending on the wavelength of the laser beam, the kind and the thickness of the semiconductor film, the kind of the reflective film, and the like.

When the distribution in effective energy irradiation intensity is created by this method on the semiconductor film and the reflective film, a region of the semiconductor film which is under the reflective film receives laser beam irradiation of reduced intensity and does not melt thoroughly. As has been mentioned, if a solid phase semiconductor region remains partially, crystal growth is started immediately after the laser beam irradiation from the solid phase semiconductor region. The solid-liquid interface that is the crystal growth front moves in the lateral direction until crystal nuclei are generated in a thoroughly melted region.

Crystal grains grow in this way and hence the obtained crystal grains can have a large grain size. Even if the region of the semiconductor film which is under the reflective film is thoroughly melted, the irradiation intensity of laser beam is not as strong as the intensity in the region of the semiconductor film which is not covered with the reflective film, and the region of the semiconductor film which is under the reflective film cools faster than the other region of the semiconductor film. Therefore crystal growth is started from the region of the semiconductor film which is under the reflective film and the crystal grains grow toward the other region of the semiconductor film. However, impurities will probably diffuse into the semiconductor film from the reflective film and cracking and peeling are likely to take place in the semiconductor film and the reflective film if the reflective film is formed directly on the semiconductor film. It is therefore desirable to form an insulating film between the semiconductor film and the reflective film.

The reflective film is polygonal in top view, and this polygon has an angle which is smaller than 60°. With the reflective film shaped as such, the crystal nuclei are generated at a smaller density in the semiconductor film below the vertex when the semiconductor film is irradiated with the laser beam. Thus collision between growing crystal grains can be avoided.

The insulating film formed between the semiconductor film and the reflective film can function also as a reflection preventive film. FIGS. 3A and 3B show changes in reflectance in the case where a silicon oxide film is formed on an amorphous silicon film (having a thickness of 55 nm) and a laser beam irradiates the films from the silicon oxide film side with the thickness of the silicon oxide film as the parameter. In the case of FIG. 3A, the wavelength of the laser beam for irradiation is 308 nm whereas a laser beam having a wavelength of 532 nm is used for the irradiation in the case of FIG. 3B. It can be seen in FIG. 3A that the reflectance changes periodically and that the silicon oxide film can function as the reflection preventive film if its thickness is that when the reflectance is low in the graphs. The insulating film is not limited to a silicon oxide film and other insulating films can function as the reflection preventive film, of course.

The substrate may be heated up to about 500° C. before the laser beam irradiation. Expectedly, this will lower the heat loss rate in the semiconductor film to increase the grain size of the crystal grains.

Thus the crystalline semiconductor film obtained through laser annealing by forming a heat retaining film between a semiconductor film and a substrate and forming a reflective film in a region of the semiconductor film which does not overlap the heat retaining film can be applied to various semiconductor devices. The crystalline semiconductor film is particularly suitable to form an active layer of a TFT.

BRIEF DESCRIPTION OF THE DRAWINGS

In the accompanying drawings:

FIGS. 1A to 1D are diagrams showing an example of a method of forming crystal grains having a large grain size at designed positions in accordance with the present invention;

FIGS. 2A to 2C are diagrams showing the example of the method of forming crystal grains having a large grain size at designed positions in accordance with the present invention;

FIG. 6A is a diagram showing an example of a phase shift mask, FIG. 6B is a graph showing a distribution in intensity of laser beam after the beam passes through the phase shift mask, and FIG. 6C is a diagram showing an example of conventional methods for forming crystal grains having a large grain size at designed positions;

FIGS. 7A and 7B are diagrams showing an example of the method of forming crystal grains having a large grain size at designed positions in accordance with the present invention;

FIGS. 8A and 8B are diagrams showing another example of the method of forming crystal grains having a large grain size at designed positions in accordance with the present invention;

FIGS. 9A to 9C are cross sectional views showing a process of manufacturing a pixel TFT and a driver circuit TFT;

FIGS. 10A to 10C are cross sectional views showing the process of manufacturing a pixel TFT and a driver circuit TFT;

DETAILED DESCRIPTION OF THE PREFERRED EMBODIMENTS

Figure 3A:
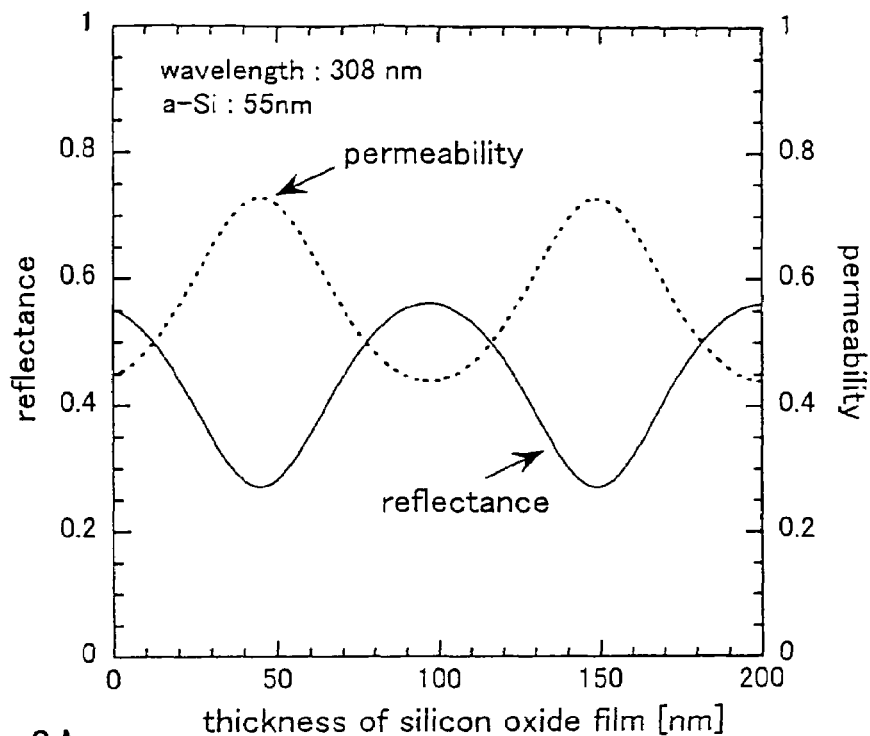
FIGS. 3A and 3B are graphs showing the reflectance against a silicon oxide film in laser beam irradiation with the thickness of the silicon oxide film as the parameter, where FIG. 3A uses a laser beam having a wavelength of 308 nm for the irradiation and FIG. 3B uses a laser beam having a wavelength of 532 nm for the irradiation.

An embodiment mode of the present invention will be described with reference to cross sectional views of FIGS. 1A to 2C. In FIGS. 1D and 2C, top views as well as sectional views are shown.

A base insulating film 12 is formed on a substrate 11 by a known method (LPCVD, plasma CVD, or the like) from a silicon nitride film, a silicon oxynitride film, a silicon oxide film or a like other film.

A heat retaining film 13 is formed on the base insulating film 12. The heat retaining film is a silicon oxide film that contains methyl ($CH_3$), ethyl ($C_2H_5$), propyl ($C_3H_7$), butyl ($C_4H_9$), vinyl ($C_2H_3$), phenyl ($C_6H_5$), or $CF_3$ group (functional group containing silicon oxide film). Alternatively, a porous silicon film or a porous silicon oxide film is used to form the heat retaining film.

Considering the heat conductivity of the substrate (1.4 W/m·k, in the case of a quartz substrate) and the heat conductivity of silicon oxide (1 to 2 W/m·k), the heat retaining film 13 desirably has a heat conductivity of 1.0 W/m·k or less, more desirably 0.3 W/m·k or less.

After the heat retaining film 13 is formed, photolithography is used to form a resist mask and to etch unnecessary portions of the heat retaining film 13 away. A heat retaining film 14 is thus formed.

If the heat retaining film 14 is the functional group containing silicon oxide film, it is desirable to form a first insulating film 15 in order to prevent impurities in the heat retaining film 14 from diffusing into a semiconductor film to be formed later. The first insulating film 15 is an insulating film, typically a silicon nitride film, a silicon oxynitride film or a silicon oxide film, formed by a known method (LPCVD, plasma CVD or the like). The first insulating film 15 is formed using a silicon nitride film, a silicon oxynitride film, a silicon oxide film or the like by a known method also when the heat retaining film 14 is a porous silicon film or a porous silicon oxide film. This is because the porous silicon film or the porous silicon oxide film has about $10^{11}$ pores per centimeters square on its surface and the heat retaining film 14 should have a level surface.

The first insulating film 15 is etched to remove unnecessary portions using a resist mask by photolithography. A first insulating film 16 is formed as a result.

Next, a semiconductor film 17 is formed by a known method such as plasma CVD or sputtering to a thickness of 10 to 200 nm (preferably 30 to 100 nm). The semiconductor film 17 may be an amorphous semiconductor film, a microcrystalline semiconductor film or a polycrystalline semiconductor film. A compound semiconductor film having an amorphous structure, such as an amorphous silicon germanium film, can also be used.

Figure 3B:
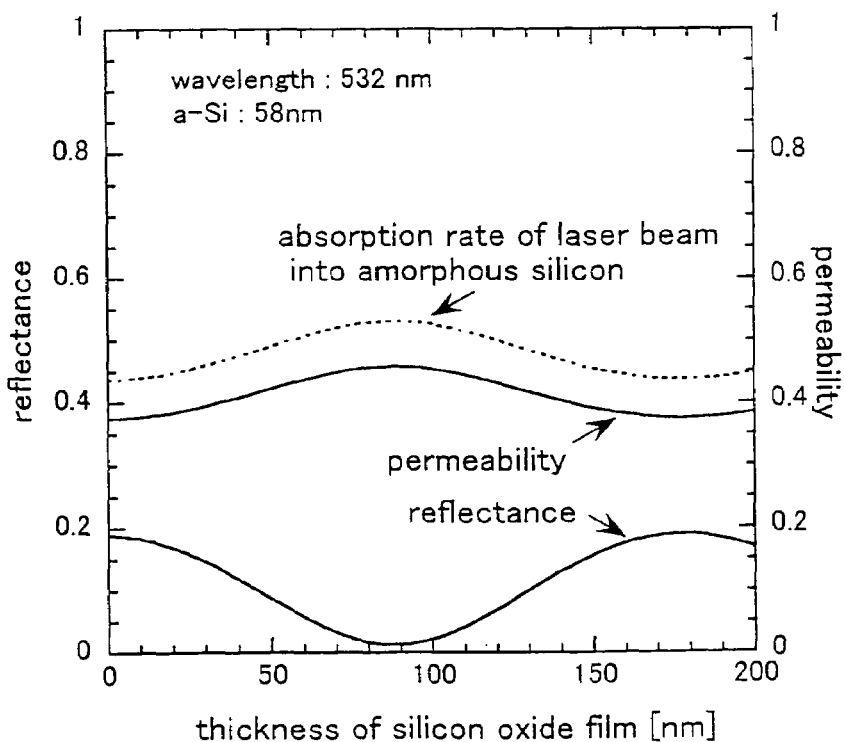
Figure 4:
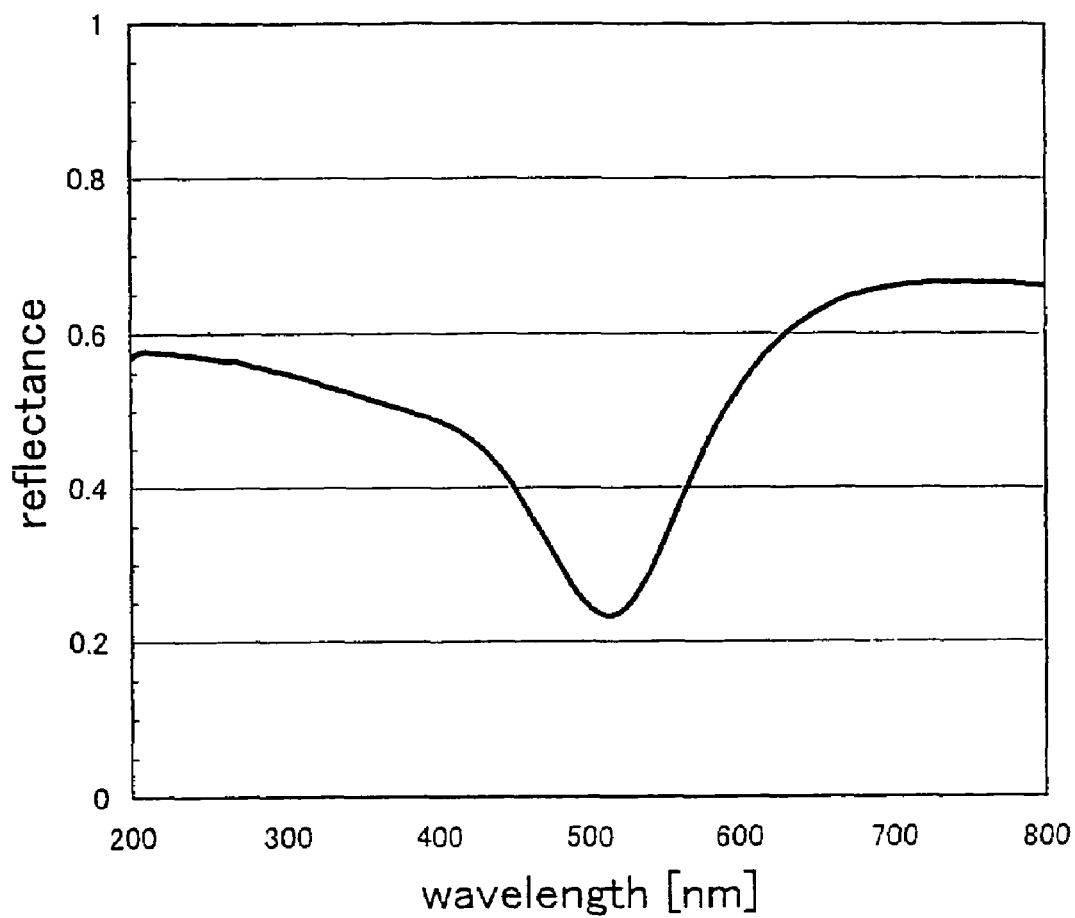
FIG. 4 is a graph showing the relation between the wavelength and the reflectance against an amorphous silicon film with a thickness of 55 nm.
Figure 5:
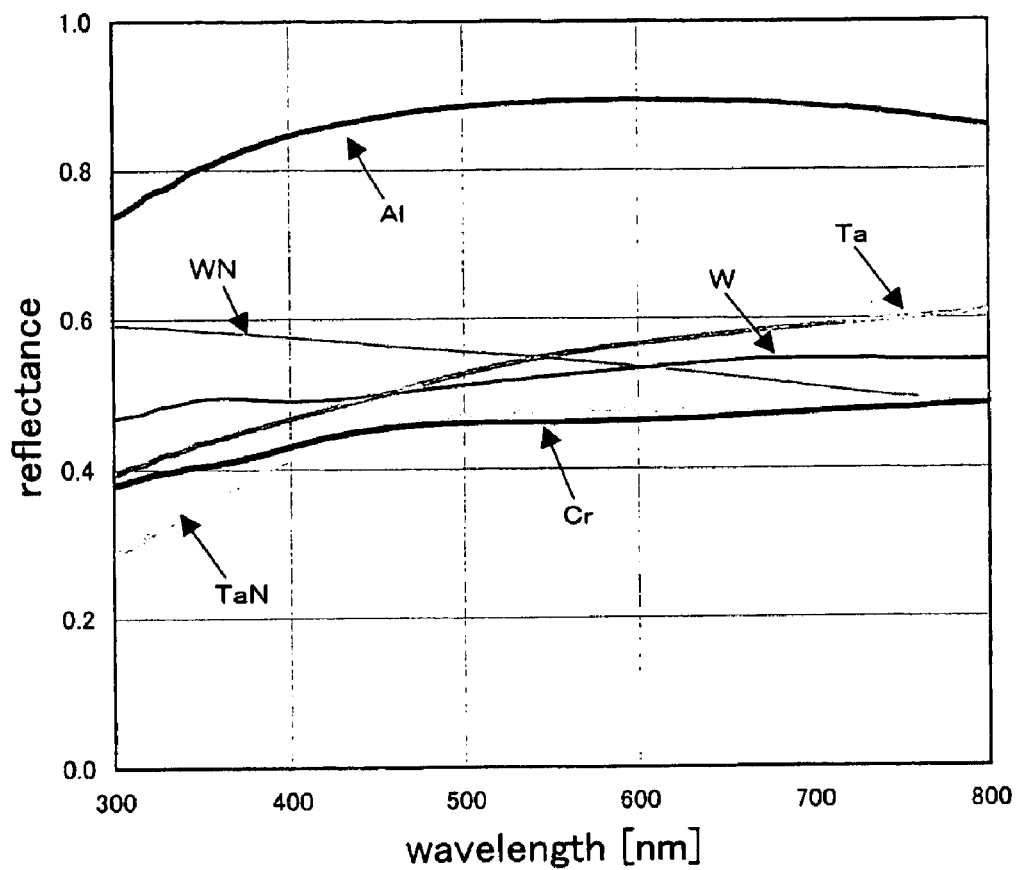
FIG. 5 is a graph showing the relation between the wavelength and the reflectance against metals.

In order to prevent impurities in a reflective film to be formed later from diffusing into the semiconductor film, a second insulating film 18 is desirably formed on the semiconductor film 17. If the second insulating film 18 is to function simultaneously as a reflection preventive film, the second insulating film has to have a thickness that lowers the reflectance. Such thickness varies depending on the wavelength of the laser beam as shown in FIGS. 3A and 3B. The second insulating film 18 is formed using a silicon nitride film, a silicon oxynitride film, a silicon oxide film or a like other film by a known method (LPCVD, plasma CVD or the like).

On the second insulating film 18, a reflective film 19 is formed. If the reflective film 19 is a metal film, the film is formed by a known method such as sputtering or evaporation to a thickness of 10 to 200 nm (preferably 10 to 100 nm). The metal film may be formed of an element selected from the group consisting of Ta, W, Ti, Mo, Al, Cu, Cr and Nd, or of an alloy material, or compound material, containing the above elements as its main ingredient. An Ag—Pd—Cu alloy may also be used.

After forming the reflective film 19, a resist mask is formed and unnecessary portions of the reflective film 19 is etched away by photolithography. A reflective film 20 is thus formed. The shape of the reflective film 20 is not particularly limited but desirably is polygonal in top view with one or more angles of the polygon being smaller than 60°. The angle smaller than 60° will hereinafter be called a vertex A. With the reflective film shaped as such, crystal nuclei are generated at a smaller density in the semiconductor film below a region around the vertex A while the semiconductor film that has been irradiated with a laser beam cools down. Thus collision between growing crystal grains can be avoided.

If the second insulating film 18 deos not function as the reflection preventive film, photolithography is then used so that a resist mask is formed, and the region of the second insulating film which does not overlap the reflective film is etched away. A second insulating film 21 is obtained as a result.

FIG. 2A is a diagram illustrating a crystallization step in which the substrate is irradiated with a laser beam from the front side. In crystallization by laser annealing, hydrogen contained in the semiconductor film is desirably released before the annealing. Appropriately, the semiconductor film is exposed in nitrogen atmosphere at 400 to 500° C. for about an hour to reduce the hydrogen content to 5 atom % or less. This improves the resistance of the film against laser remarkably.

A description is given of a laser oscillator used in laser annealing. An excimer laser is high power and currently can generate a high frequency pulse on the order of 300 Hz, and hence it is often used in laser annealing. Other than the pulse oscillation excimer laser, a continuous wave excimer laser, an Ar laser, a YAG laser, a $YVO_4$ laser, a YLF laser, etc. may be used. The laser beam irradiation can be carried out in vacuum, atmospheric air, nitrogen atmosphere, or other types of atmospheres. The substrate may be heated up to about 500° C. before the laser beam irradiation. This will lower the heat loss rate in the semiconductor film to increase the grain size of the crystal grains.

One of the laser oscillators listed above is chosen to irradiate the substrate from the front side in one of the above atmospheres, whereby the semiconductor film is crystallized.

Here, setting the ends of the reflective film as the borders, a region including the heat retaining film 14 is designated as a region A, a region including the reflective film 20 is designated as a region B, and a region that does not include the heat retaining film 14 nor the reflective film 20 is designated as a region C. (See FIGS. 2B and 2C.)

When irradiated with a laser beam, the semiconductor film is melted. However, the effective irradiation intensity of laser beam on the semiconductor film in the region B is lower than on the semiconductor film in the region A and the region C because the semiconductor film in the region B is covered with the reflective film, which reflects the laser beam. Accordingly a solid phase semiconductor region 23 is left below the reflective film, and crystal growth begins immediately after the laser beam irradiation from the solid phase semiconductor region 23 following the temperature gradient created in the semiconductor film. The density of generated crystal nuclei 24 is particularly low in the solid phase semiconductor region 23 in the vicinity of the vertex A, for the vertex A has a small angle of less than 60°. Furthermore, the semiconductor film remains melted for a long time in the region A due to the presence of the heat retaining film 14. Therefore the crystal nuclei 24 grow toward the region A. Thus crystal grains having a large grain size are formed in the semiconductor film in the region A. In the region C, the semiconductor film does not have the heat retaining film 14 underneath and hence cools faster than in the region A to generate crystal nuclei and start the crystal growth. In this way, a crystalline semiconductor film 25 is formed in which crystal grains have a grain size larger than that of the semiconductor film before the laser beam irradiation.

The crystalline semiconductor film 25 formed by being irradiated with a laser beam is heated at 300 to 450° C. in an atmosphere containing 3 to 100% of hydrogen, or heated at 200 to 450° C. in an atmosphere containing hydrogen that is generated by plasma. The heat treatment reduces the remaining defects.

The reflective film is then removed by photolithography or other methods, and then the second insulating film (18 or 21) is removed by photolithography or other methods.

The crystalline semiconductor film 25 formed in this way has a region 26 in which crystal grains having a large grain size are formed as shown in the top view of FIG. 2C. If the region 26 is used for a channel formation region of a TFT, the obtained TFT can have improved electric characteristics.

Embodiment 1

Embodiment 1 of the present invention will be described with reference to cross sectional views of FIGS. 1A to 2C. In FIGS. 1D and 2C, top views as well as cross sectional views are shown.

In FIG. 1A, a substrate is denoted by 11. The substrate 11 may be a glass substrate. Examples of the glass substrate include a synthesized quartz glass substrate, and a non-alkaline glass substrate such as a barium borosilicate substrate or an aluminoborosilicate glass substrate. Transparent films such as PC (polycarbonate), PAr (polyarylate), PES (polyether sulfon) and PET (polyethylene telephthalate) may be used instead. For example, Corning No. 7059 glass or No. 1737 glass (product of Corning Incorporated.) is a preferable material for the substrate 11.

A base insulating film 12 is formed on the substrate 11 by a known method (LPCVD, plasma CVD, or the like) from a silicon nitride film, a silicon oxynitride film, a silicon oxide film or a like other film. In this embodiment, a silicon oxynitride film (composition ratio: Si=32%, O=27%, N=24%, H=17%) is formed to a thickness of 50 nm.

On the base insulating film 12, a heat retaining film 13 is formed using a functional group containing silicon oxide film. A description is given on a method of forming the heat retaining film 13 from a silicon oxide film that contains methyl ($CH_3$), ethyl ($C_2H_5$), propyl ($C_3H_7$), butyl ($C_4H_9$), vinyl ($C_2H_3$), phenyl ($C_6H_5$), or $CF_3$ group. The film is formed by a vapor phase method or a liquid phase method, depending on the organic material used as the row material of the film. A desirable thickness of the heat retaining film 13 is 100 nm to 1000 nm (more desirably 200 to 500 nm). By optimizing the thickness of the heat retaining film, the cooling rate of a semiconductor film in a laser annealing step is controlled. If the heat retaining film is thinner than 100 nm, the film cannot provide sufficient heat retaining effect. On the other hand, if the heat retaining film is thicker than 1000 nm, it causes cracking (fissure) in the semiconductor film to be formed later and hence is not desirable In this embodiment, a methyl ($CH_3$) containing silicon oxide film is formed to a thickness of 50 nm.

After the heat retaining film 13 is formed, photolithography is used to form a resist mask and to etch unnecessary portions of the heat retaining film 13 away. A heat retaining film 14 is thus formed. In etching the heat retaining film 13, dry etching that uses fluorine-based gas or wet etching that uses a fluorine-based solution may be employed. When the wet etching is chosen, for example, the etchant may be a mixture of 7.13% of ammonium hydrogen fluoride ($NH_4HF_2$) and 15.4% of ammonium fluoride ($NH_4F$). (The mixture is commercially available by the trade name of LAL500 from Stella Chemipha Inc.)

Subsequently, a first insulating film 15 is formed in order to prevent impurities in the heat retaining film 14 from diffusing into the semiconductor film to be formed later. The first insulating film 15 may be a silicon nitride film, a silicon oxynitride film or a silicon oxide film formed by a known method (LPCVD, plasma CVD or the like).

The first insulating film 15 is etched to remove unnecessary portions using a resist mask and photolithography. A first insulating film 16 is formed as a result. In etching the first insulating film 15, dry etching that uses fluorine-based gas or wet etching that uses a fluorine-based solution may be employed. When the wet etching is chosen, for example, the etchant may be a mixture of 7.13% of ammonium hydrogen fluoride ($NH_4HF_2$) and 15.4% of ammonium fluoride ($NH_4F$). (The mixture is commercially available by the trade name of LAL500 from Stella Chemipha Inc.)

Next, a semiconductor film 17 is formed by a known method such as plasma CVD or sputtering to a thickness of 10 to 200 nm (preferably 30 to 100 nm). The semiconductor film 17 may be an amorphous semiconductor film, a microcrystalline semiconductor film or a polycrystalline semiconductor film. A compound semiconductor film having an amorphous structure, such as an amorphous silicon germanium film, can also be used. In this embodiment, an amorphous silicon film with a thickness of 55 nm is formed by plasma CVD.

In order to prevent impurities in a reflective film to be formed later from diffusing into the semiconductor film, a second insulating film 18 is formed on the semiconductor film 17. The second insulating film 18 is formed using a silicon nitride film, a silicon oxynitride film, a silicon oxide film or a like other film by a known method (LPCVD, plasma CVD or the like). In this embodiment, a silicon oxynitride film (composition ratio: Si=32%, O=27%, N=24%, H=17%) is formed to a thickness of 50 nm.

On the second insulating film 18, a reflective film 19 is formed. If the reflective film 19 is a metal film, the film is formed by a known method such as sputtering or evaporation to a thickness of 10 to 200 nm (preferably 10 to 100 nm). The metal film may be formed of an element selected from the group consisting of Ta, W, Ti, Mo, Al, Cu, Cr and Nd, or of an alloy material, or compound material, containing the above elements as its main ingredient. An Ag—Pd—Cu alloy may also be used. In this embodiment, a Cr film with a thickness of 50 nm is formed.

After forming the reflective film 19, a resist mask is formed and unnecessary portions of the reflective film 19 is etched away by photolithography. A reflective film 20 is thus formed. The shape of the reflective film 20 is not particularly limited but desirably is polygonal in top view with one or more angles of the polygon being smaller than 60°. The angle smaller than 60° will hereinafter be called a vertex A. With the reflective film shaped as such, crystal nuclei are generated at a smaller density in the semiconductor film below a region around the vertex A while the semiconductor film that has been irradiated with a laser beam cools down. Thus collision between growing crystal grains can be avoided.

Then photolithography is used to form a resist mask on the second insulating film 18 and etch away the region of the second insulating film which does not overlap the reflective film. A second insulating film 21 is obtained as a result.

FIG. 2A is a diagram illustrating a crystallization step in which the substrate is irradiated with a laser beam from the front side. In crystallization by laser annealing, hydrogen contained in the semiconductor film is desirably released before the annealing Appropriately, the semiconductor film is exposed in nitrogen atmosphere at 400 to 500° C. for about an hour to reduce the hydrogen content to 5 atom % or less. This improves the resistance of the film against laser remarkably.

A description is given of a laser oscillator used in laser annealing. An excimer laser is high power and currently can generate a high frequency pulse on the order of 300 Hz, and hence it is often used in laser annealing. Other than the pulse oscillation excimer laser, a continuous wave excimer laser, an Ar laser, a YAG laser, a $YVO_4$ laser, a YLF laser, etc. may be used. The laser beam irradiation can be carried out in vacuum, atmospheric air, nitrogen atmosphere, or other types of atmospheres. The substrate may be heated up to about 500° C. before the laser beam irradiation. This will lower the heat loss rate in the semiconductor film to increase the grain size of the crystal grains.

To crystallize the semiconductor film, a pulse oscillation XeCl excimer laser oscillator is used in this embodiment and the substrate is irradiated with its laser beam from the front side in atmospheric air.

Here, setting the ends of the reflective film as the borders, a region including the heat retaining film 14 is designated as a region A, a region including the reflective film 20 is designated as a region B, and a region that does not include the heat retaining film 14 nor the reflective film 20 is designated as a region C. (See FIGS. 2B and 2C.)

When irradiated with a laser beam, the semiconductor film is melted. However, the effective irradiation intensity of laser beam on the semiconductor film in the region B is lower than on the semiconductor film in the region A and the region C because the semiconductor film in the region B is covered with the reflective film, which reflects the laser beam. Accordingly a solid phase semiconductor region 23 is left below the reflective film, and crystal growth begins immediately after the laser beam irradiation from the solid phase semiconductor region 23 following the temperature gradient created in the semiconductor film. The density of generated crystal nuclei 24 is particularly low in the solid phase semiconductor region 23 in the vicinity of the vertex A, for the vertex A has a small angle of less than 60°. Furthermore, the semiconductor film remains melted for a long time in the region A due to the presence of the heat retaining film 14. Therefore the crystal nuclei 24 grow toward the region A. Thus crystal grains having a large grain size are formed in the semiconductor film in the region A. In the region C, the semiconductor film does not have the heat retaining film 14 underneath and hence cools faster than in the region A to generate crystal nuclei and start the crystal growth.

Thus a crystalline semiconductor film 25 is formed by the laser beam irradiation. The crystalline semiconductor film 25 is heated at 300 to 450° C. in an atmosphere containing 3 to 100% of hydrogen, or heated at 200 to 450° C. in an atmosphere containing hydrogen that is generated by plasma. The heat treatment reduces the remaining defects.

The reflective film is then removed by photolithography or other methods, and then the second insulating film is removed by photolithography or other methods.

The crystalline semiconductor film 25 formed in this way has a region 26 in which crystal grains having a large grain size are formed as shown in the top view of FIG. 2C. If the region 26 is used for a channel formation region of a TFT, the obtained TFT can have improved electric characteristics.

Embodiment 2

This embodiment shows an example of forming a crystalline semiconductor film by a method different from the one described in Embodiment 1. The only difference between this embodiment and Embodiment 1 is in the step of forming the heat retaining film 13 and the subsequent steps are identical. Therefore explanations for the identical steps are omitted here.

First, a substrate is prepared as in Embodiment 1. The substrate, denoted by 11, may be a glass substrate. Examples of the glass substrate include a synthesized quartz glass substrate, and a non-alkaline glass substrate such as a barium borosilicate substrate or an aluminoborosilicate glass substrate. Transparent films such as PC (polycarbonate), PAr (polyarylate), PES (polyether sulfon) and PET (polyethylene telephthalate) may be used instead. For example, Corning No. 7059 glass or No. 1737 glass (product of Corning Incorporated) is a preferable material for the substrate 11.

A base insulating film 12 is formed on the substrate 11 by a known method (LPCVD, plasma CVD, or the like) from a silicon nitride film, a silicon oxynitride film, a silicon oxide film or a like other film. In this embodiment, a silicon oxynitride film (composition ratio: Si=32%, O=27%, N=24%, H=17%) is formed to a thickness of 50 nm.

Now, a description is given on the method of forming the heat retaining film 13 on the base insulating film 12 from a silicon oxide film that contains methyl ($CH_3$), ethyl ($C_2H_5$), propyl ($C_3H_7$), butyl ($C_4H_9$), vinyl ($C_2H_3$), phenyl ($C_6H_5$), or $CF_3$ group. An example of the method of forming the heat retaining film includes generating glow discharge with a mixture of TEOS and $O_2$, at a reaction pressure of 20 to 100 Pa, a substrate temperature of 200 to 350° C., a high frequency of 13.56 MHz, and a power density of 0.1 to 0.5 $W/cm^2$. Though the optimal conditions depend on the characteristic of the apparatus, the substrate temperature and the electric power density are usually set low. The low temperature and density leave unbroken $C_xH_y$ bonds, whereby a functional group containing silicon oxide film is formed. In this embodiment, a methyl containing silicon oxide film is formed to a thickness of 50 nm.

Considering the heat conductivity of the substrate (1.4 W/m·k, in the case of a quartz substrate) and the heat conductivity of a silicon oxide film (1 to 2 W/m·k), the heat retaining film 13 desirably has a heat conductivity of 1.0 W/m·k or less, more desirably 0.3 W/m·k or less.

After the heat retaining film 13 is formed, photolithography is used to form a resist mask and to etch unnecessary portions of the heat retaining film 13 away. A heat retaining film 14 is thus formed. In etching the heat retaining film 13, dry etching that uses fluorine-based gas or wet etching that uses a fluorine-based solution may be employed. When the wet etching is chosen, for example, the etchant may be a mixture of 7.13% of ammonium hydrogen fluoride ($NH_4HF_2$) and 15.4% of ammonium fluoride ($NH_4F$). (The mixture is commercially available by the trade name of LAL500 from Stella Chemipha Inc.)

The subsequent steps follow the corresponding steps of Embodiment 1 to obtain a crystalline semiconductor film shown in FIG. 2C. The obtained crystalline semiconductor film has a region 26 in which crystal grains having a large grain size are formed as shown in the top view of FIG. 2C. If the region 26 is used for a channel formation region of a TFT, the obtained TFT can have improved electric characteristics.

Embodiment 3

This embodiment shows an example of forming a crystalline semiconductor film by a method different from the ones described in Embodiments 1 and 2. The only difference between this embodiment and Embodiment 1 is in the step of forming the heat retaining film 13 and the subsequent steps are identical. Therefore explanations for the identical steps are omitted here.

First, a substrate is prepared as in Embodiment 1. The substrate, denoted by 11, may be a glass substrate. Examples of the glass substrate include a synthesized quartz glass substrate, and a non-alkaline glass substrate such as a barium borosilicate substrate or an aluminoborosilicate glass substrate. Transparent films such as PC (polycarbonate), PAr (polyarylate), PES (polyether sulfon) and PET (polyethylene telephthalate) may be used instead. For example, Corning No. 7059 glass or No. 1737 glass (product of Corning Incorporated) is a preferable material for the substrate 11.

A base insulating film 12 is formed on the substrate 11 by a known method (LPCVD, plasma CVD, or the like) from a silicon nitride film, a silicon oxynitride film, a silicon oxide film or a like other film. In this embodiment, a silicon oxynitride film (composition ratio: Si=32%, O=27%, N=24%, H=17%) is formed to a thickness of 50 nm.

On the base insulating film 12, a silicon oxide film containing phenyl is formed as the heat retaining film 13. This silicon oxide film is formed by, for example, depositing a mixture gas of phenyltrichlorosilane ($PhSiCl_3$) and water ($H_2O$) directly on the substrate that has been heated up to 60 to 100° C. In this embodiment, the phenyl containing silicon oxide film has a thickness of 50 nm.

Considering the heat conductivity of the substrate (1.4 W/m·k, in the case of a quartz substrate) and the heat conductivity of silicon oxide (1 to 2 W/m·k), the heat retaining film 13 desirably has a heat conductivity of 1.0 W/m·k or less, more desirably 0.3 W/m·k or less.

After the heat retaining film 13 is formed, photolithography is used to form a resist mask and to etch unnecessary portions of the heat retaining film 13 away. A heat retaining film 14 is thus formed. In etching the heat retaining film 13, dry etching that uses fluorine-based gas or wet etching that uses a fluorine-based solution may be employed. When the wet etching is chosen, for example, the etchant may be a mixture of 7.13% of ammonium hydrogen fluoride ($NH_4HF_2$) and 15.4% of ammonium fluoride ($NH_4F$). (The mixture is commercially available by the trade name of LAL500 from Stella Chemipha Inc.)

The subsequent steps follow the corresponding steps of Embodiment 1 to obtain a crystalline semiconductor film shown in FIG. 2C. The obtained crystalline semiconductor film has a region 26 in which crystal grains having a large grain size are formed as shown in the top view of FIG. 2C. If the region 26 is used for a channel formation region of a TFT, the obtained TFT can have improved electric characteristics.

Embodiment 4

This embodiment shows an example of forming a crystalline semiconductor film by a method different from the ones described in Embodiments 1 through 3. The only difference between this embodiment and Embodiment 1 is in the step of forming the heat retaining film 13 and the subsequent steps are identical. Therefore explanations for the identical steps are omitted here.

First, a substrate is prepared as in Embodiment 1. The substrate, denoted by 11, may be a glass substrate. Examples of the glass substrate include a synthesized quartz glass substrate, and a non-alkaline glass substrate such as a barium borosilicate substrate or an aluminoborosilicate glass substrate. Transparent films such as PC (polycarbonate), PAr (polyarylate), PES (polyether sulfon) and PET (polyethylene telephthalate) may be used instead. For example, Corning No. 7059 glass or No. 1737 glass (product of Corning Incorporated) is a preferable material for the substrate 11.

A base insulating film 12 is formed on the substrate 11 by a known method (LPCVD, plasma CVD, or the like) from a silicon nitride film, a silicon oxynitride film, a silicon oxide film or a like other film. In this embodiment, a silicon oxynitride film (composition ratio: Si=32%, O=27%, N=24%, H=17%) is formed to a thickness of 50 nm.

On the base insulating film 12, a silicon oxide film containing $CF_3$ group is formed as the heat retaining film 13. This silicon oxide film is formed by, for example, depositing a mixture gas of $CF_3Si(CH_3)_3$ and ozone ($O_3$) on the substrate that has been heated up to 300 to 400° C. In this embodiment, the silicon oxide film containing $CF_3$ group has a thickness of 50 nm.

Considering the heat conductivity of the substrate (1.4 W/m·k, in the case of a quartz substrate) and the heat conductivity of silicon oxide (1 to 2 W/m·k), the heat retaining film 13 desirably has a heat conductivity of 1.0 W/m·k or less, more desirably 0.3 W/m·k or less.

After the heat retaining film 13 is formed, photolithography is used to form a resist mask and to etch unnecessary portions of the heat retaining film 13 away. A heat retaining film 14 is thus formed. In etching the heat retaining film 13, dry etching that uses fluorine-based gas or wet etching that uses a fluorine-based solution may be employed. When the wet etching is chosen, for example, the etchant may be a mixture of 7.13% of ammonium hydrogen fluoride ($NH_4HF_2$) and 15.4% of ammonium fluoride ($NH_4F$). (The mixture is commercially available by the trade name of LAL500 from Stella Chemipha Inc.)

The subsequent steps follow the corresponding steps of Embodiment 1 to obtain a crystalline semiconductor film shown in FIG. 2C. The obtained crystalline semiconductor film has a region 26 in which crystal grains having a large grain size are formed as shown in the top view of FIG. 2C. If the region 26 is used for a channel formation region of a TFT, the obtained TFT can have improved electric characteristics.

Embodiment 5

This embodiment shows an example of forming a crystalline semiconductor film by a method different from the ones described in Embodiments 1 through 4. The only difference between this embodiment and Embodiment 1 is in the step of forming the heat retaining film 13 and the subsequent steps are identical. Therefore explanations for the identical steps are omitted here.

First, a substrate is prepared as in Embodiment 1. The substrate, denoted by 11, may be a glass substrate. Examples of the glass substrate include a synthesized quartz glass substrate, and a non-alkaline glass substrate such as a barium borosilicate substrate or an aluminoborosilicate glass substrate. Transparent films such as PC (polycarbonate), PAr (polyarylate), PES (polyether sulfon) and PET (polyethylene telephthalate) may be used instead. For example, Corning No. 7059 glass or No. 1737 glass (product of Corning Incorporated) is a preferable material for the substrate 11.

A base insulating film 12 is formed on the substrate 11 by a known method (LPCVD, plasma CVD, or the like) from a silicon nitride film, a silicon oxynitride film, a silicon oxide film or a like other film. In this embodiment, a silicon oxynitride film (composition ratio: Si=32%, O=27%, N=24%, H=17%) is formed to a thickness of 50 nm.

On the base insulating film 12, a porous silicon film is formed as the heat retaining film 13. The porous silicon film is formed by, for example, adding an iodine solution to an SOG solution through spin coating, drying the mixture to separate iodine, and subjecting it to heat treatment at a temperature of about 400° C. In this embodiment, the porous silicon film has a thickness of 50 nm.

Considering the heat conductivity of the substrate (1.4 W/m·k, in the case of a quartz substrate) and the heat conductivity of silicon oxide (1 to 2 W/m·k), the heat retaining film 13 desirably has a heat conductivity of 1.0 W/m·k or less, more desirably 0.3 W/m·k or less.

After the heat retaining film 13 is formed, photolithography is used to form a resist mask and to etch unnecessary portions of the heat retaining film 13 away. A heat retaining film 14 is thus formed. In etching the heat retaining film 13, dry etching that uses fluorine-based gas or wet etching that uses a fluorine-based solution may be employed. When the wet etching is chosen, for example, the etchant may be a mixture of 7.13% of ammonium hydrogen fluoride ($NH_4HF_2$) and 15.4% of ammonium fluoride ($NH_4F$). (The mixture is commercially available by the trade name of LAL500 from Stella Chemipha Inc.)

When the heat retaining film 14 is a porous silicon film, the heat retaining film 14 has about $10^{11}$ pores per centimeters square on its surface. In order to level the surface of the heat retaining film 14, a first insulating film 15 is formed using a silicon nitride film, a silicon oxynitride film, a silicon oxide film or the like by a known method.

The subsequent steps follow the corresponding steps of Embodiment 1 to obtain a crystalline semiconductor film shown in FIG. 2C. The obtained crystalline semiconductor film has a region 26 in which crystal grains having a large grain size are formed as shown in the top view of FIG. 2C. If the region 26 is used for a channel formation region of a TFT, the obtained TFT can have improved electric characteristics.

Embodiment 6

This embodiment shows an example of forming a crystalline semiconductor film by a method different from the ones described in Embodiments 1 through 5. The only difference between this embodiment and Embodiment 1 is in the step of forming the heat retaining film 13 and the subsequent steps are identical. Therefore explanations for the identical steps are omitted here.

First, a substrate is prepared as in Embodiment 1. The substrate, denoted by 11, may be a glass substrate. Examples of the glass substrate include a synthesized quartz glass substrate, and a non-alkaline glass substrate such as a barium borosilicate substrate or an aluminoborosilicate glass substrate. Transparent films such as PC (polycarbonate), PAr (polyarylate), PES (polyether sulfon) and PET (polyethylene telephthalate) may be used instead. For example, Corning No. 7059 glass or No. 1737 glass (product of Corning Incorporated) is a preferable material for the substrate 11.

A base insulating film 12 is formed on the substrate 11 by a known method (LPCVD, plasma CVD, or the like) from a silicon nitride film, a silicon oxynitride film, a silicon oxide film or a like other film. In this embodiment, a silicon oxynitride film (composition ratio: Si=32%, O=27%, N=24%, H=17%) is formed to a thickness of 50 nm.

On the base insulating film 12, a porous silicon oxide film is formed as the heat retaining film 13. The porous silicon oxide film can readily be formed by anodizing a silicon substrate. The silicon substrate may be formed from semiconductor grade silicon such as CZ silicon or FZ silicon but not limited thereto. It may be a solar battery grade (SOG grade) silicon substrate. The silicon substrate may be replaced by a glass substrate or a quartz substrate on which a silicon film is formed. Anodization is carried by mixing hydrofluoric acid (HF) and ethanol in equal parts to prepare an anodization solution and setting the current density to 1 to 200 mA/cm$^2$. The thickness of the porous silicon oxide film is 1 to 5 μm. In this way, the heat retaining film 13 is formed on the substrate from a porous silicon oxide film.

Considering the heat conductivity of the substrate (1.4 W/m·k, in the case of a quartz substrate) and the heat conductivity of silicon oxide (1 to 2 W/m·k), the heat retaining film 13 desirably has a heat conductivity of 1.0 W/m·k or less, more desirably 0.3 W/m·k or less.

After the heat retaining film 13 is formed, photolithography is used to form a resist mask and to etch unnecessary portions of the heat retaining film 13 away. A heat retaining film 14 is thus formed. In etching the heat retaining film 13, dry etching that uses fluorine-based gas or wet etching that uses a fluorine-based solution may be employed. When the wet etching is chosen, for example, the etchant may be a mixture of 7.13% of ammonium hydrogen fluoride (NH$_4$HF$_2$) and 15.4% of ammonium fluoride (NH$_4$F). (The mixture is commercially available by the trade name of LAL500 from Stella Chemipha Inc.)

When the heat retaining film 14 is a porous silicon oxide film, the heat retaining film 14 has about 10$^{11}$ pores per centimeters square on its surface. In order to level the surface of the heat retaining film 14, a first insulating film 15 is formed using a silicon nitride film, a silicon oxynitride film, a silicon oxide film or the like by a known method.

The subsequent steps follow the corresponding steps of Embodiment 1 to obtain a crystalline semiconductor film shown in FIG. 2C. The obtained crystalline semiconductor film has a region 26 in which crystal grains having a large grain size are formed as shown in the top view of FIG. 2C. If the region 26 is used for a channel formation region of a TFT, the obtained TFT can have improved electric characteristics.

Embodiment 7

This embodiment shows an example of forming a crystalline semiconductor film by a method different from the ones described in Embodiments 1 through 6. The only difference between this embodiment and Embodiment 1 is in the step of forming the second insulating film 18 and the preceding steps are identical. Therefore explanations for the identical steps are omitted here.

Following Embodiment 1, the process is finished up through the step of forming the semiconductor film 17.

Then the second insulating film 18 is formed on the semiconductor film 17 in order to prevent impurities in a reflective film to be formed later from diffusing into the semiconductor film. To make the second insulating film 18 function also as a reflection preventive film, the second insulating film has to have the optimal thickness. The optimal thickness varies depending on the wavelength of the laser beam as shown in FIGS. 3A and 3B. The second insulating film 18 is formed using a silicon nitride film, a silicon oxynitride film, a silicon oxide film or a like other film by a known method (LPCVD, plasma CVD or the like). In this embodiment, a silicon oxide film with a thickness of 45 nm is formed by plasma CVD.

On the second insulating film 18, a reflective film 19 is formed. If the reflective film 19 is a metal film, the film is formed by a known method such as sputtering or evaporation to a thickness of 10 to 200 nm (preferably 10 to 100 nm). The metal film may be formed of an element selected from the group consisting of Ta, W, Ti, Mo, Al, Cu, Cr and Nd, or of an alloy material, or compound material, containing the above elements as its main ingredient. An Ag—Pd—Cu alloy may also be used. In this embodiment, a Cr film is formed to a thickness of 50 nm.

After forming the reflective film 19, a resist mask is formed and unnecessary portions of the reflective film 19 is etched away by photolithography. A reflective film 20 is thus formed. The shape of the reflective film 20 is not particularly limited but desirably is polygonal in top view with one or more vertex of the polygon being smaller than 60°. The vertex desirably coincides with the end of the heat retaining film through the first insulating film, the semiconductor film and the second insulating film. The vertex smaller than 60° will hereinafter be called a vertex A. With the reflective film shaped as such, crystal nuclei are generated at a smaller density in the semiconductor film below a region around the vertex A while the semiconductor film that has been irradiated with a laser beam cools down. Thus collision between growing crystal grains can be avoided (FIG. 7A).

FIG. 7B is a diagram illustrating a crystallization step in which the substrate is irradiated with a laser beam from the front side. In crystallization by laser annealing, hydrogen contained in the semiconductor film is desirably released before the annealing. Appropriately, the semiconductor film is exposed in nitrogen atmosphere at 400 to 500° C. for about an hour to reduce the hydrogen content to 5 atom % or less. This improves the resistance of the film against laser remarkably.

A description is given of a laser oscillator used in laser annealing. An excimer laser is high power and currently can generate a high frequency pulse on the order of 300 Hz, and hence it is often used in laser annealing. Other than the pulse oscillation excimer laser, a continuous oscillation excimer laser, an Ar laser, a YAG laser, a YVO$_4$ laser, a YLF laser, etc. may be used. The laser beam irradiation can be carried out in vacuum, atmospheric air, nitrogen atmosphere, or other types of atmospheres. The substrate may be heated up to about 500° C. before the laser beam irradiation. This will lower the heat loss rate in the semiconductor film to increase the grain size of the crystal grains.

One of the laser oscillators listed above is chosen to irradiate the substrate from the front side in one of the above atmospheres, whereby the semiconductor film is crystallized.

Here, setting the ends of the reflective film as the borders, a region including the heat retaining film 14 is designated as a region A, a region including the reflective film 20 is designated as a region B, and a region that does not include the heat retaining film 14 nor the reflective film 20 is designated as a region C. (See FIGS. 8A and 8B.)

When irradiated with a laser beam, the semiconductor film is melted. However, the effective irradiation intensity of laser beam on the semiconductor film in the region B is lower than on the semiconductor film in the region A and the region C because the semiconductor film in the region B is covered with the reflective film, which reflects the laser beam. Accordingly a solid phase semiconductor region 33 is left below the reflective film, and crystal growth begins immediately after the laser beam irradiation from the solid phase semiconductor region 33 following the temperature gradient created in the semiconductor film. On the other hand, the irradiation intensity of laser beam is strong in the regions A and C owing to the effect of the reflection preventive film. The density of generated crystal nuclei 34 is particularly low in the solid phase semiconductor region 33 in the vicinity of the vertex A, for the vertex A has a small angle of less than 60°. Furthermore, the semiconductor film remains melted for a long time in the region A due to the presence of the heat retaining film 14. Therefore the crystal nuclei 34 grow toward the region A. Thus crystal grains having a large grain size are formed in the semiconductor film in the region A. In the region C, the semiconductor film does not have the heat retaining film 14 underneath and hence cools faster than in the region A to generate crystal nuclei and start the crystal growth.

Thus a crystalline semiconductor film 35 is formed through the laser beam irradiation. The crystalline semiconductor film 35 is heated at 300 to 450° C. in an atmosphere containing 3 to 100% of hydrogen, or heated at 200 to 450° C. in an atmosphere containing hydrogen that is generated by plasma. The heat treatment reduces the remaining defects.

The reflective film is then removed by photolithography or other methods, and then the second insulating film is removed by photolithography or other methods.

The crystalline semiconductor film 35 formed in this way has a region 36 in which crystal grains having a large grain size are formed as shown in the top view of FIG. 8B. If the region 36 is used for a channel formation region of a TFT, the obtained TFT can have improved electric characteristics.

This embodiment may be combined freely with one of Embodiments 1 through 6.

Embodiment 8

The manufacturing method of the pixel portion and TFT (n-channel type TFT and p-channel type TFT) of the driver circuit provided at the periphery of the pixel portion simultaneously on the same substrate is explained in detail using FIGS. 9 to 12. In this specification, the substrate on which is formed the driver circuit, the pixel TFT and retention capacitor is referred to as an active matrix substrate as a matter of convenience.

The crystalline semiconductor film shown in FIG. 9A can be obtained by whichever method among Embodiments 1 to 7. In this embodiment, the manufacturing method of TFT is explained by corresponding the cross sectional view of FIG. 9A and the cross sectional view taken along the dashed line of A-A' of FIG. 2C or FIG. 8B. It is also possible that TFT is formed by using the cross-sectional view which is used when the crystalline semiconductor film is formed in Embodiments 1 to 7. In FIG. 9A, the reference numeral 101*a* to 101*f* are heat insulating films, and reference numeral 102*a* to 102*f* are insulating films for preventing diffusion of impurity element from the heat insulating film.

First, above mentioned crystalline semiconductor film is patterned in desired shape to obtain the semiconductor films 103*a* to 103*f*. In this embodiment, above mentioned crystalline semiconductor film is subjected to a patterning process using a photolithography method, to obtain the semiconductor films 103*a* to 103*f*.

Further, after the formation of the semiconductor films 103*a* to 103*f*, a minute amount of impurity element (boron or phosphorus) may be doped to control a threshold value of the TFT.

A gate insulating film 107 is then formed for covering the semiconductor films 103*a* to 103*f*. The gate insulating film 107 is formed of an insulating film containing silicon by a plasma CVD method or a sputtering method into a film thickness of from 40 to 150 nm. In this embodiment, the gate insulating film 107 is formed of a silicon nitride oxide film into a thickness of 110 nm by a plasma CVD method (composition ratio Si=32%, O=59%, N=7%, and H=2%). Of course, the gate insulating film is not limited to the silicon nitride oxide film, and an other insulating film containing silicon may be used as a single layer or a lamination structure.

Besides, when the silicon oxide film is used, it can be possible to be formed by a plasma CVD method in which TEOS (tetraethyl orthosilicate) and $O_2$ are mixed and discharged at a high frequency (13.56 MHZ) electric power density of 0.5 to 0.8 W/cm$^2$ with a reaction pressure of 40 Pa and a substrate temperature of 300 to 400° C. Good characteristics as the gate insulating film can be obtained in the manufactured silicon oxide film thus by subsequent thermal annealing at 400 to 500° C.

Then, as shown in FIG. 9A, on the gate insulating film 107, a first conductive film 108 with a thickness of 20 to 100 nm and a second conductive film 109 with a thickness of 100 to 400 nm are formed and laminated. In this embodiment, the first conductive film 108 of TaN film with a film thickness of 30 nm and the second conductive film 109 of a W film with a film thickness of 370 nm are formed into lamination. The TaN film is formed by sputtering method with a Ta target under a nitrogen containing atmosphere. Besides, the W film is formed by the sputtering method with a W target. The W film may be formed by a thermal CVD method using tungsten hexafluoride (WF$_6$). Whichever method is used, it is necessary to make the material have low resistance for use as the gate electrode, and it is preferred that the resistivity of the W film is set to less than or equal to 20 μΩcm. By making the crystal grains large, it is possible to make the W film have lower resistivity. However, in the case where many impurity elements such as oxygen are contained within the W film, crystallization is inhibited and the resistance becomes higher. Therefore, in this embodiment, by forming the W film by a sputtering method using a tungsten target with a high purity of 99.9999%, and in addition, by taking sufficient consideration to prevent impurities within the, gas phase from mixing therein during the film formation, a resistivity of from 9 to 20 μΩcm can be realized.

Note that, in this embodiment, the first conductive film 108 is made of TaN, and the second conductive film 109 is made of W, but the material is not particularly limited thereto, and either film may be formed of an element selected from the group consisting of Ta, W, Ti, Mo, Al, Cu, Cr, and Nd, or an alloy material or a compound material containing the above element as its main constituent.

Besides, a semiconductor film, typified by a polycrystalline silicon film doped with an impurity element such as phosphorus, may be used. Further, an AgPdCu alloy may be used. Besides, any combination may be employed such as a combination in which the first conductive film is formed of tantalum (Ta) and the second conductive film is formed of W, a combination in which the first conductive film is formed of titanium nitride (TiN) and the second conductive film is formed of W, a combination in which the first conductive film is formed of tantalum nitride (TaN) and the second conductive film is formed of Al, or a combination in which the first conductive film is formed of tantalum nitride (TaN) and the second conductive film is formed of Cu.

Next, masks 110 to 115 made of resist are formed using a photolithography method, and a first etching process is performed in order to form electrodes and wirings. This first etching process is performed with the first and second etching conditions. In This embodiment, as the first etching conditions, an ICP (inductively coupled plasma) etching method is used, a gas mixture of $CF_4$, $Cl_2$ and $O_2$ is used as an etching gas, the gas flow rate is set to 25/25/10 sccm, and plasma is generated by applying a 500 W RF (13.56 MHz) electric power to a coil shape electrode under 1 Pa. A dry etching device with ICP (Model E645-☐ICP) produced by Matsushita Electric Industrial Co. Ltd. is used here. A 150 W RF (13.56 MHz) electric power is also applied to the substrate side (test piece stage) to effectively apply a negative self-bias voltage. The W film is etched with the first etching conditions, and the end portion of the first conductive layer is formed into a tapered shape.

Thereafter, the first etching conditions are changed into the second etching conditions without removing the masks 110 to 115 made of resist, a mixed gas of $CF_4$ and $Cl_2$ is used as an etching gas, the gas flow rate is set to 30/30 sccm, and plasma is generated by applying a 500 W RF (13.56 MHz) power to a coil shape electrode under 1 Pa to thereby perform etching for about 30 seconds. A 20 W RF (13.56 MHz) electric power is also applied to the substrate side (test piece stage) to effectively a negative self-bias voltage. The W film and the TaN film are both etched on the same order with the second etching conditions in which $CF_4$ and $Cl_2$ are mixed. Note that, the etching time may be increased by approximately 10 to 20% in order to perform etching without any residue on the gate insulating film.

In the first etching process, the end portions of the first and second conductive layers are formed to have a tapered shape due to the effect of the bias voltage applied to the substrate side by adopting masks of resist with a suitable shape. The angle of the tapered portions may be set to 15° to 45°. Thus, first shape conductive layers 117 to 122 (first conductive layers 117a to 122a and second conductive layers 117b to 122b) constituted of the first conductive layers and the second conductive layers are formed by the first etching process. Reference numeral 116 denotes a gate insulating film, and regions of the gate insulating film which are not covered by the first shape conductive layers 117 to 122 are made thinner by approximately 20 to 50 nm by etching.

Then, a first doping process is performed to add an impurity element for imparting an n-type conductivity to the semiconductor layer without removing the mask made of resist (FIG. 9B). Doping may be carried out by an ion doping method or an ion injecting method. The condition of the ion doping method is that a dosage is $1 \times 10^{13}$ to $5 \times 10^{15}$ atoms/$cm^2$, and an acceleration voltage is 60 to 100 keV. In this embodiment, the dosage is $1.5 \times 10^{15}$ atoms/$cm^2$ and the acceleration voltage is 80 keV. As the impurity element for imparting the n-type conductivity, an element which belongs to group 15 of the periodic table, typically phosphorus (P) or arsenic (As) is used, and phosphorus is used here. In this case, the conductive layers 117 to 122 become masks to the impurity element for imparting the n-type conductivity, and high concentration impurity regions 123 to 127 are formed in a self-aligning manner. The impurity element for imparting the n-type conductivity is added to the high concentration impurity regions 123 to 127 in the concentration range of $1 \times 10^{20}$ to $1 \times 10^{21}$ atoms/$cm^3$.

Next, the second etching process is carried out without removing the mask comprising a resist. $CF_4$ and $Cl_2$ and $O_2$ are used for an etching gas and the W film is selectively etched. At this occasion, there are formed second conductive layers 128b through 133b by the second etching process. Meanwhile, the first conductive layers 117a through 122a are hardly etched and first conductive layers 128a through 133a are formed. Next, by carrying out a second doping process, a state of FIG. 9C is provided. In doping, the second conductive layers 128b through 133b are used as masks against an impurity element and the doping is carried out such that the impurity element is added to semiconductor layers on lower sides of taper portions of first conductive layers. In this way, there are formed impurity regions 134 through 138 overlapping the first conductive layers. A concentration of phosphorus (P) added to the impurity region is provided with a gradual concentration gradient in accordance with a film thickness of the taper portion of the first conductive layer. Further, in the semiconductor layer overlapping the taper portion of the first conductive layer, from an end portion of the taper portion of the first conductive layer toward an inner side, the impurity concentration is more or less reduced, however, the concentration stays to be substantially the same degree. Further, the first impurity regions 123 through 127 are also added with the impurity element to thereby form impurity regions 139 through 143.

Next, the third etching process is carried out without removing the mask comprising a resist. The third etching process is carried out for partially etching a taper portion of the first conductive layer and reducing a region overlapping the semiconductor layer. The third etching is carried out by using $CHF_3$ for an etching gas and using a reactive ion etching process (RIE process). And also the third etching process can be using an ICP process. By the third etching, there are formed first conductive layers 144 through 149. At this occasion, the insulating film 116 is simultaneously etched and there is formed an insulating film 150 and 151.

By the third etching, there are formed impurity regions (LDD regions) 134a through 138a not overlapping the first conductive layers 144 through 148. Further, impurity regions (GOLD region) 134b through 138b stay to overlap the first conductive layers 144 through 148.

Thereby, according to the embodiment, in Embodiment 8, a difference between the impurity concentration at the impurity regions (GOLD region) 134b through 138b overlapping the first conductive layers 144 through 148 and the impurity concentration at the impurity regions (LDD regions) 134a through 138a not overlapping the first conductive layers 144 through 148, can be reduced, and a reliability can be promoted.

Next, after removing the mask comprising a resist, there are formed masks 152 through 154 comprising resists are newly formed and a third doping process is carried out. By the third doping process, there are formed impurity regions 155 through 160 added with an impurity element for providing a conductive type reverse to the conductive type, mentioned above, to the semiconductor layer for constituting an activation layer of a p-channel type TFT. The first conductive layers 128a through 132a are used as masks against the impurity element and the impurity element for providing p-type is added to thereby form the impurity regions in a self-aligning manner. According to the embodiment, the impurity regions 155 through 160 are formed by an ion doping process using diborane ($B_2H_6$). In the third doping process, the semiconductor layer for forming the n-channel type TFT is covered by the masks 152 through 154 comprising resists. Although the impurity regions 155 through 160 are respectively added with phosphorus by different concentrations by the first doping process and the second doping process, by carrying out the doping process in any of the regions such that the concentration of the impurity element for providing p-type becomes $2 \times 10^{20}$ through $2 \times 10^{21}$ atoms/cm$^3$, the regions function as the source region and the drain region of the p-channel type TFT and accordingly, no problem is posed. According to the embodiment, a portion of the semiconductor layer for constituting the activation layer of the p-channel type TFT is exposed and therefore, there is an advantage that the impurity element (boron) is easier to add than in Embodiment 8.

By the above-described steps, the respective semiconductor layers are formed with the impurity regions.

Next, the masks 152 through 154 comprising resists are removed and a first interlayer insulating film 161 is formed. The first interlayer insulating film 161 is formed by an insulating film including silicon having the thickness of 100 through 200 nm by using a plasma CVD process or a sputtering process. According to the embodiment, a silicon oxynitride film having a film thickness of 150 nm is formed by a plasma CVD process. Naturally, the first interlayer insulating film 161 is not limited to the silicon oxynitride film but other insulating film including silicon may be used as a single layer or a laminated structure.

Next, as shown in FIG. 10C, there is carried out a step of activating the impurity elements added to the respective semiconductor layers. The activating step is carried out by a thermal annealing process using a furnace annealing furnace. The thermal annealing process may be carried out at 400 through 700° C., representatively, 500 through 550° C. in a nitrogen atmosphere having an oxygen concentration equal to or smaller than 1 ppm, preferably, equal to or smaller than 0.1 ppm and according to the embodiment, the activating process is carried out by a heat treatment at 550° C. for 4 hours. Further, other than the thermal annealing process, a laser annealing process or a rapid thermal annealing process (RTA process) is applicable.

Further, according to the embodiment, simultaneously with the activating process, nickel used as a catalyst in crystallization is gettered by the impurity regions 139, 141, 142, 155 and 158 including phosphorus at a high concentration and a nickel concentration in the semiconductor layer for mainly constituting a channel forming region is reduced. According to TFT having the channel forming region fabricated in this way, the off current value is reduced, crystallizing performance is excellent and accordingly, high electric field effect mobility is provided and excellent electric characteristic can be achieved.

Further, the activating process may be carried out prior to forming the first interlayer insulating film. However, when a used wiring material is weak at heat, it is preferable to carry out the activating process after forming the interlayer insulating film (insulating film having a major component of silicon, for example, silicon nitride film) for protecting the wiring as in the embodiment.

Further, there is carried out a step of hydrogenating the semiconductor layer by carrying out heat treatment at 300 through 550° C. for 1 through 12 hours in an atmosphere including 3 through 100% of hydrogen. According to the embodiment, there is carried out a heat treatment at 410° C. for 1 hour in a nitrogen atmosphere including about 3% of hydrogen. This step is the step of terminating dangling bond of the semiconductor layer by hydrogen included in the interlayer insulating film. As other means of hydrogenation, plasma hydrogenation (using hydrogen excited by plasma) may be carried out.

Further, when a laser annealing process is used as the activating process, after carrying out the hydrogenation, it is preferable to irradiate laser beam such as excimer laser or YAG laser.

A second interlayer insulating film 162 made from an inorganic insulating material or from an organic insulating material is formed next on the first interlayer insulating film 161. An acrylic resin film having a film thickness of 1.6 μm is formed in embodiment 8, and the material used may have a viscosity from 10 to 1000 cp, preferably between 40 and 200 cp. A material in which unevenness is formed on its surface is used. Further a film having a level surface may also be used as the second interlayer insulating film 162.

In order to prevent specular reflection, the surface of a pixel electrode is made uneven by forming the second interlayer insulating film from a material which forms an uneven surface in embodiment 8. Further, the electrode surface can be made to be uneven and have light scattering characteristics, and therefore a convex portion may also be formed in a region below the pixel electrode. The formation of the convex portion can be performed by the same photomask as that for forming the TFTs, and therefore it can be formed without increasing the number of process steps. Note that the convex portion may also be formed suitably on the substrate of pixel portion region outside of the wirings and TFTs. Unevenness is formed in the surface of the pixel electrode along the unevenness formed in the surface of the insulating film which covers the convex portion.

Wirings 163 to 167 for electrically connecting the various impurity regions are then formed in a driver circuit in order. Note that a lamination film of a 50 nm thick Ti film and a 500 nm thick alloy film (an alloy of Al and Ti) is patterned for forming the wirings.

Furthermore, a pixel electrode 170, a gate wiring 169, and a connection electrode 168 are formed in a pixel portion. (See FIG. 11.) An electrical connection is formed with the pixel TFT and the source wiring (lamination of the impurity regions 133b and 149) by the connection electrode 168. Further, the gate wiring 169 forms an electrical connection with the gate electrode of the pixel TFT. The pixel electrode 170 forms an electrical connection with the drain region of the pixel TFT, and in addition, forms an electrical connection with the semiconductor layer 158 which functions as one electrode forming the storage capacitor. It is preferable to use a material having superior reflectivity, such as a film having Al or Ag as its main constituent, or a lamination film of such films, as the pixel electrode 170.

A CMOS circuit composed of an n-channel TFT 501 and a p-channel TFT 502, a driver circuit 506 having an n-channel TFT 503, and the pixel portion having a pixel TFT 504 and a storage capacitor 505 can thus be formed on the same substrate. The active matrix substrate is thus completed.

The n-channel TFT 501 of the driver circuit 506 has: a channel forming region 171; the low concentration impurity region 134b (GOLD region) which overlaps with the first conductive layer 144 that structures a portion of the gate electrode; the low concentration impurity region 134a (LDD region) formed on the outside of the gate electrode; and the high concentration impurity region 139 which functions as a source region or a drain region. The p-channel TFT 502, which forms the CMOS circuit with the n-channel TFT 501 by an electrical connection through the electrode 166, has: a channel forming region 172; the impurity region 157 which overlaps with the gate electrode; the impurity region 156 which is formed on the outside of the gate electrode; and the high concentration impurity region 155 which functions as a source region or a drain region. Further, the n-channel TFT 503 has: a channel forming region 173; the low concentration impurity region 136b (GOLD region) which overlaps with the first conductive layer 146 that structures a portion of the gate electrode; the low concentration impurity region 136a (LDD region) which is formed on the outside of the gate electrode; and the high concentration impurity region 141 which functions as a source region or a drain region.

The pixel TFT 504 of the pixel portion has: a channel forming region 174; the low concentration impurity region 137b (GOLD region) which overlaps with the first conductive layer 147 that structures a portion of the gate electrode; the low concentration impurity region 137a (LDD region) formed on the outside of the gate electrode; and the high concentration impurity region 142 which functions as a source region or a drain region. Further, impurity element imparting a p-type conductivity is added to the semiconductor layers 158 to 160 which function as one electrode of the storage capacitor 505. The storage capacitor 505 is formed by an electrode (lamination of the conductive layer 148 and the region 132b) and the semiconductor layers 158 to 160, with the insulating film 151 functioning as a dielectric.

The edge portions of the pixel electrodes are arranged so as to overlap the source wirings such that gaps between the pixel electrodes are shielded without using a black matrix with the pixel structure of embodiment 8.

Figure 11:
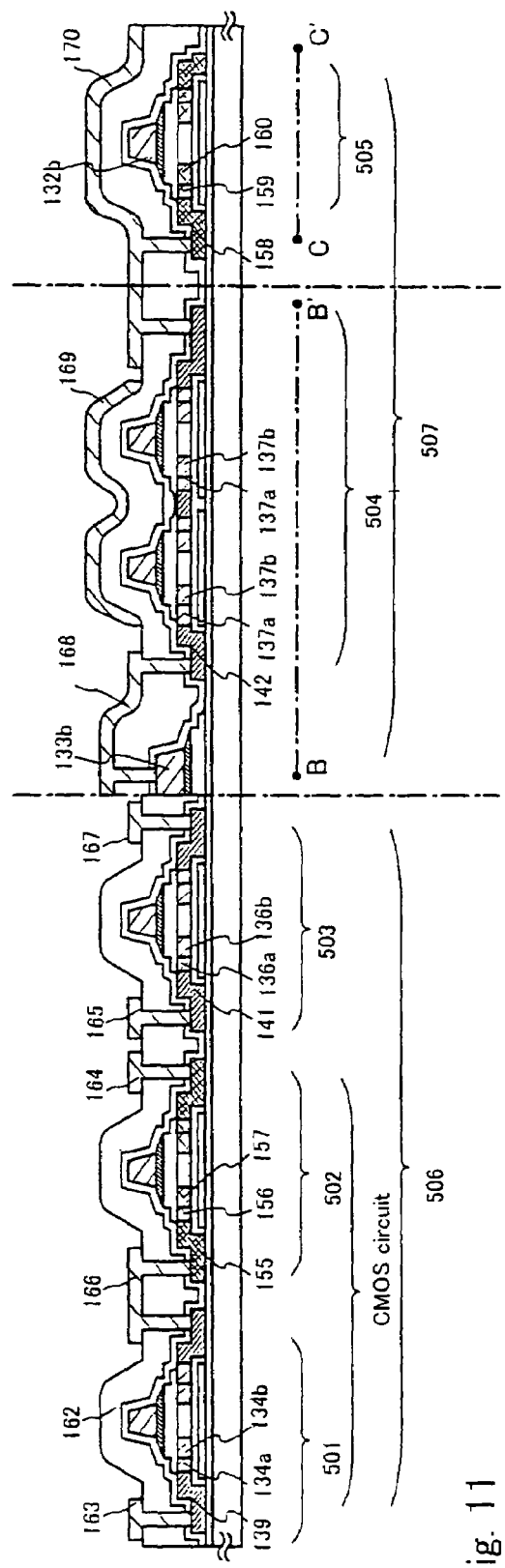
FIG. 11 is a cross sectional view showing the process of manufacturing a pixel TFT and a driver circuit TFT.
Figure 12:
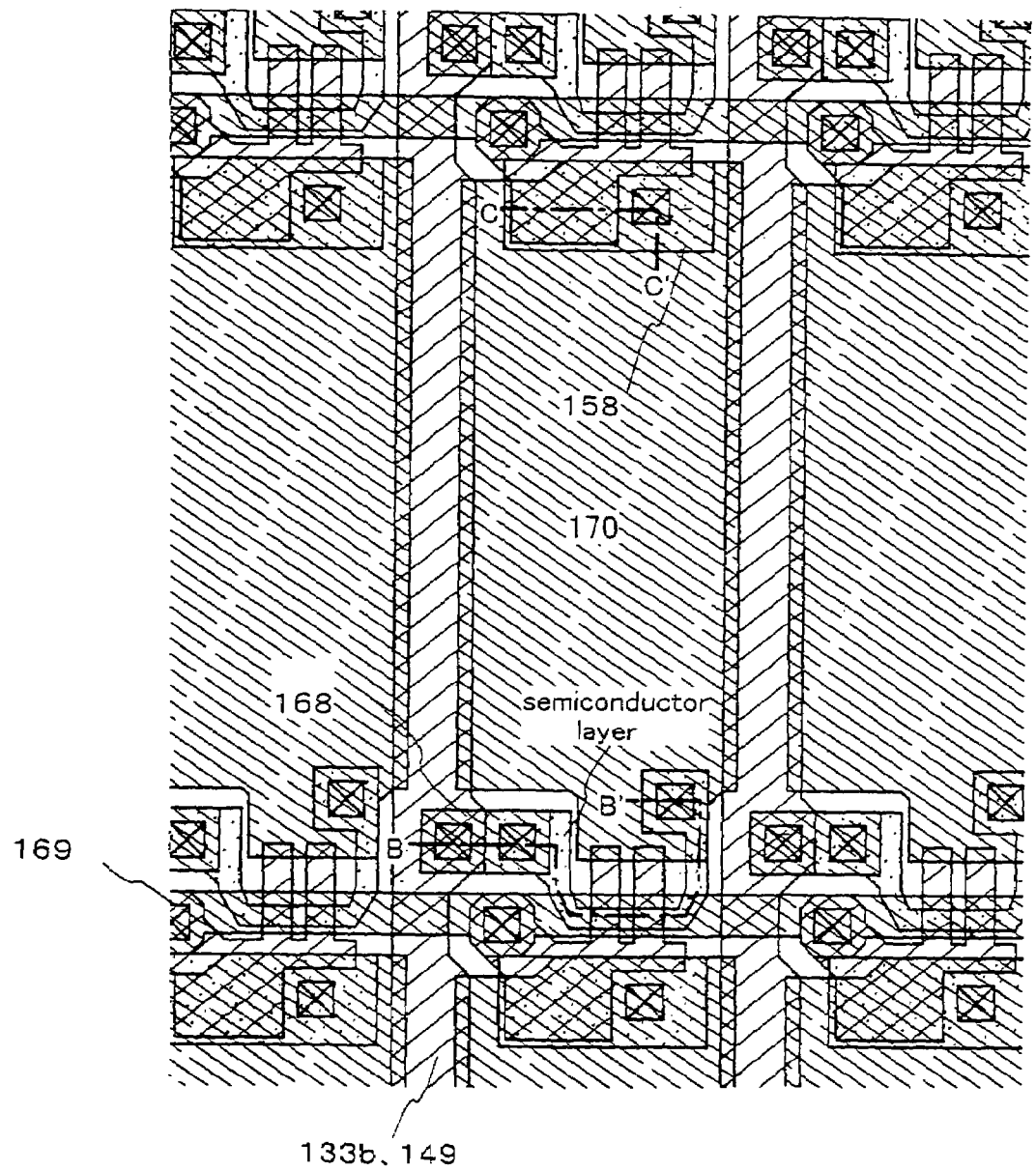
FIG. 12 is a top view showing the structure of a pixel TFT.

A top surface diagram of the pixel portion of the active matrix substrate manufactured by embodiment 8 is shown in FIG. 12. Note that portions corresponding to those of FIGS. 9 to 11 use the same reference numerals. The dashed line B-B' of FIG. 12 corresponds to a cross sectional diagram of FIG. 11 cut along the dashed line B-B', and the dashed line C-C' of FIG. 12 corresponds to a cross sectional diagram of FIG. 11 cut along the dashed line C-C'.

The number of photomasks required to manufacture the active matrix substrate can be set to five in accordance with the processes shown by embodiment 8. As a result, the number of process steps can be reduced, and this can contribute to a lowering of the manufacturing cost and increased yield ratio.

A structure such as that above optimizes the structure of the pixel TFT and TFTs composing each circuits of the driver circuit in response to the specifications required, and it is possible to increase the operating performance and the reliability of the semiconductor device. In addition, by forming the gate electrode using a conductive material having heat resistance, the LDD regions, and source regions and drain regions are easily activated. Moreover, the wiring resistance can be sufficiently lowered by forming the gate electrode using a gate wiring low resistance material.

Embodiment 9

Figure 13:
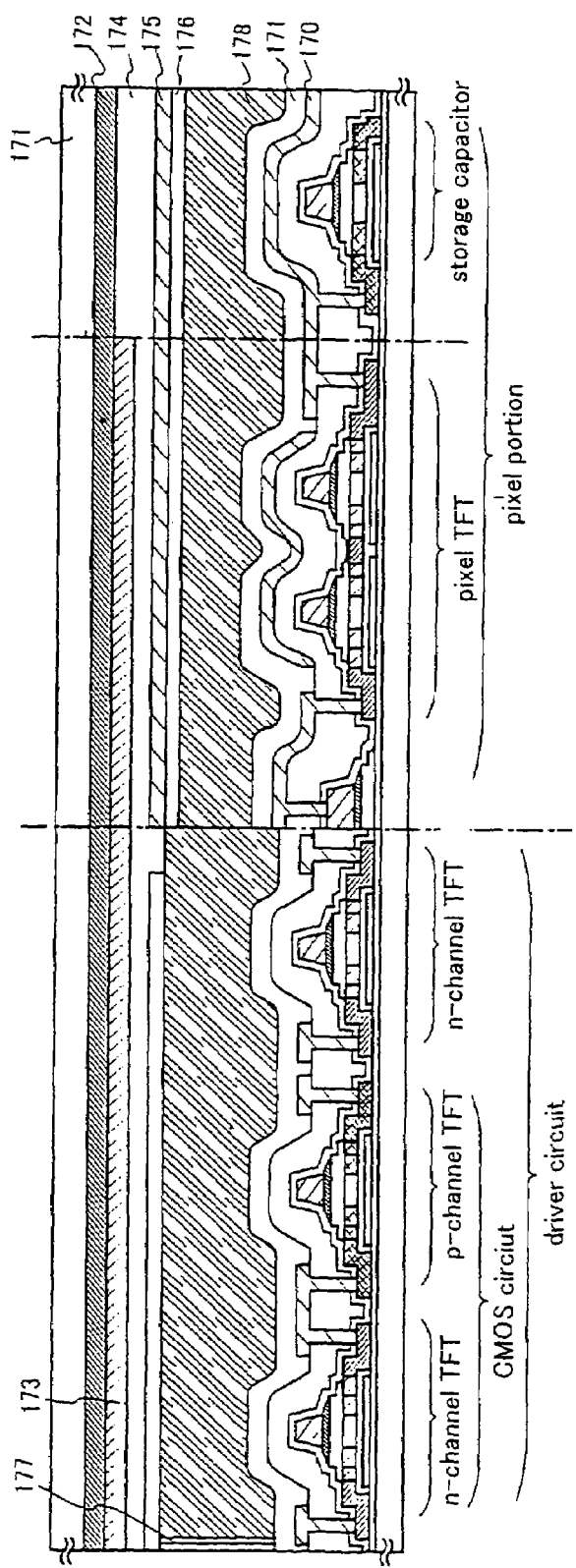
FIG. 13 is a cross sectional view showing a process of manufacturing an active matrix liquid crystal display device.

In this embodiment, a manufacturing process of a reflection type liquid crystal display device from the active matrix substrate manufactured in accordance with Embodiment 8 will be described hereinbelow. FIG. 13 is used for an explanation thereof.

First, in accordance with Embodiment 8, an active matrix substrate in a state shown in FIG. 11 is obtained, and thereafter, an orientation film 171 is formed on the active matrix substrate of FIG. 11, at least on the pixel electrode 170, and is subjected to a rubbing process. Note that, in this embodiment, before the formation of the orientation film 171, a spacer (not illustrated) for maintaining a gap between the substrates is formed at a desired position by patterning an organic film such as an acrylic resin film. Further, spherical spacers may be scattered on the entire surface of the substrate in place of the columnar like spacer.

Next, an opposing substrate 171 is prepared. The colored layers 172, 173 and a leveling film 174 are formed on the opposing substrate 171. The red-colored layer 172 and the blue-colored layer 173 are partially overlapped with each other, thereby forming a light shielding portion. Note that, the red-colored layer and a green-colored layer are partially overlapped with each other, thereby forming a light shielding portion.

In this embodiment, the substrate shown in Embodiment 8 is used. Accordingly, in FIG. 12 showing a top view of the pixel portion in accordance with Embodiment 8, light shielding must be performed at least gaps between the gate wiring 169 and the pixel electrodes 170, a gap between the gate wiring 169 and the connection electrode 168, and a gap between the connection electrode 168 and the pixel electrode 170. In this embodiment, the opposing substrate and the active matrix substrate are stuck so that the light shielding portions from laminated layer of colored layer each other overlap with the positions which need to be shielded from light.

Like this, without using a black mask, the gaps between the respective pixels are shielded from light by the light shielding portion. As a result, the reduction of the manufacturing steps can be attained.

Next, the opposing electrode 175 from transparent conductive film is formed on the leveling film 174, at least on the pixel portion. The orientation film 176 on the entire surface of the opposing substrate and the rubbing process is performed.

Then, an active matrix substrate on which a pixel portion and a driver circuit are formed is stuck with the opposing substrate by a sealing agent 177. In the sealing agent 177, a filler is mixed, and the two substrates are stuck with each other while keeping a uniform gap by the effect of this filler and the columnar spacer. Thereafter, a liquid crystal material 178 is injected between both the substrates to encapsulate the substrates completely by an encapsulant (not illustrated). A known liquid crystal material may be used as the liquid crystal material 178. Thus, the reflection type liquid crystal display device shown in FIG. 13 is completed. Then, if necessary, the active matrix substrate or the opposing substrate may be parted into desired shapes. Further, a polarizing plate are adhered to only the opposing substrate (not illustrated). Then, an FPC is adhered using a known technique.

The liquid crystal display device manufactured according to above mentioned way can be used as a display portion of various electronic device.

Embodiment 10

CMOS circuits and pixel portions formed in accordance with the present invention can be used in various electro-optical devices (active matrix type liquid crystal display, active matrix type EC display and active matrix type EL display). In other words, the present invention can be applied to all of the electronic equipments having these electro-optical devices as the display section.

The following can be given as examples of the electronic equipment: video cameras; digital cameras; projectors (rear type or front type); head mounted displays (goggle type display); car navigation systems; car stereo; personal computers; portable information terminals (such as mobile computers, portable telephones and electronic notebook). An example of these is shown in FIGS. 14, 15 and 16.

Figure 14A:
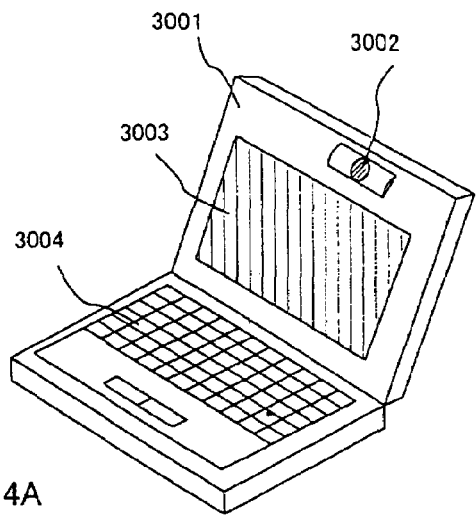
FIGS. 14A to 14F are diagrams showing examples of a semiconductor device.

FIG. 14A shows a personal computer, and it includes a main body 3001, an image input section 3002, a display portion 3003, and a keyboard 3004. The present invention is applicable to the image input section 3002, the display portion 3003, and other signal controlling circuits.

Figure 14B:
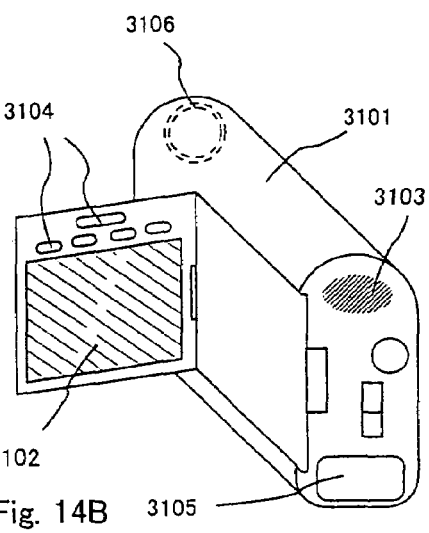

FIG. 14B shows a video camera, and it includes a main body 3101, a display portion 3102, a voice input section 3103, operation switches 3104, a battery 3105, and an image receiving section 3106. The present invention is applicable to the display portion 3102 and other signal controlling circuits.

Figure 14C:
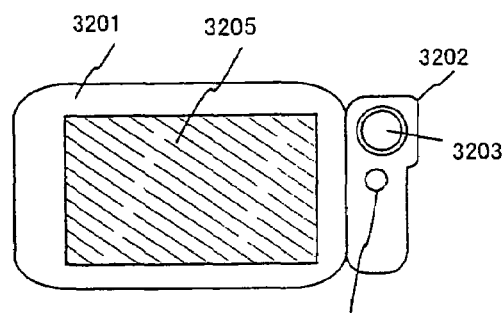

FIG. 14C shows a mobile computer, and it includes a main body 3201, a camera section 3202, an image receiving section 3203, operation switches 3204, and a display portion 3205. The present invention is applicable to the display portion 3205 and other signal controlling circuits.

Figure 14D:
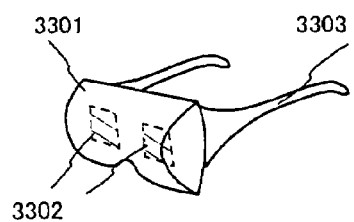

FIG. 14D shows a goggle type display, and it includes a main body 3301; a display portion 3302; and an arm section 3303. The present invention is applicable to the display portion 3302 and other signal controlling circuits.

Figure 14E:
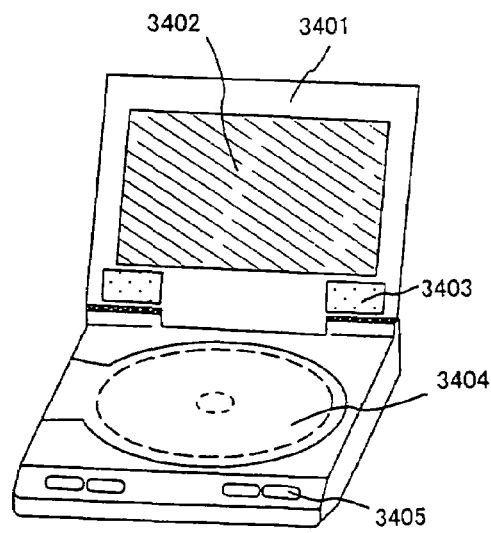

FIG. 14E shows a player using a recording medium which records a program (hereinafter referred to as a recording medium), and it includes a main body 3401; a display portion 3402; a speaker section 3403; a recording medium 3404; and operation switches 3405. This player uses DVD (digital versatile disc), CD, etc. for the recording medium, and can be used for music appreciation, film appreciation, games and Internet. The present invention is applicable to the display portion 3402 and other signal controlling circuits.

Figure 14F:
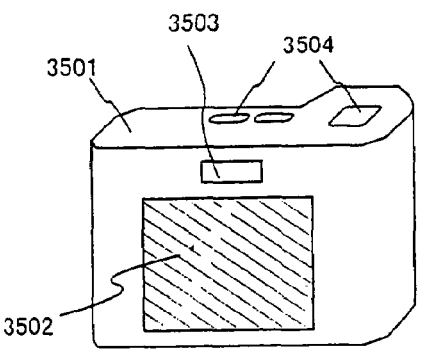

FIG. 14F shows a digital camera, and it includes a main body 3501; a display portion 3502; a view finder 3503; operation switches 3504; and an image receiving section (not shown in the figure). The present invention can be applied to the display portion 3502 and other signal controlling circuits.

Figure 15A:
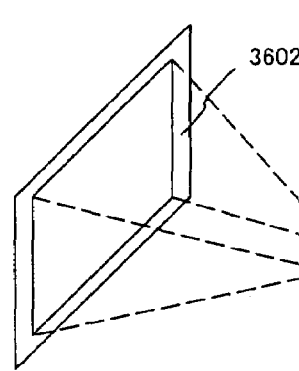
FIGS. 15A to 15D are diagrams showing examples of the semiconductor device.

FIG. 15A is a front-type projector, and it includes a projection device 3601 and a screen 3602. The present invention is applicable to a liquid crystal display device 3808 which comprises one of the projection device 3601 and other signal controlling circuits.

Figure 15B:
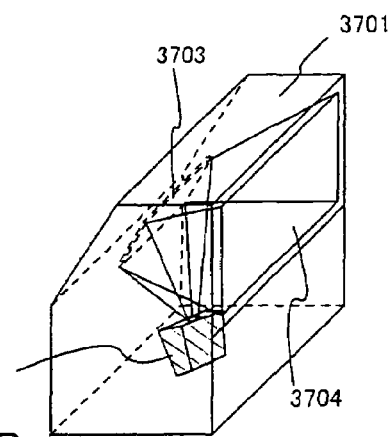

FIG. 15B is a rear-type projector, and it includes a main body 3701, a projection device 3702, a mirror 3703, and a screen 3704. The present invention is applicable to a liquid crystal display device 3808 which comprises one of the projection device 3702 and other signal controlling circuits.

Figure 15C:
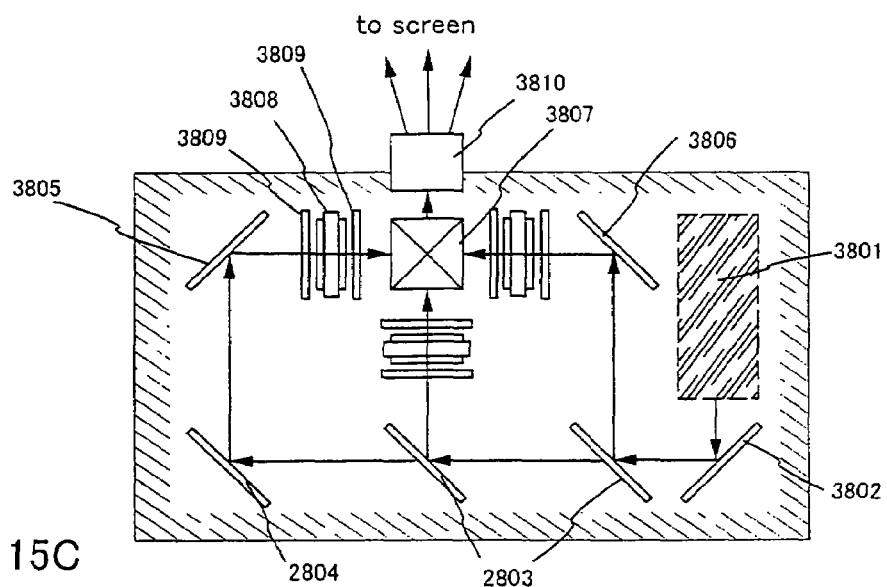

FIG. 15C is a diagram showing an example of the structure of the projection devices 3601, 3702 in FIGS. 15A and 15B. The projection device 3601 or 3702 comprises a light source optical system 3801, mirrors 3802, 3804 to 3806, dichroic mirrors 3803, a prism 3807, liquid crystal display devices 3808, phase difference plates 3809, and a projection optical system 3810. The projection optical system 3810 is composed of an optical system including a projection lens. This example shows an example of three plate type but not particularly limited thereto. For instance, the invention may be applied also to a single plate type optical system. Further, in the light path indicated by an arrow in FIG. 15C, an optical system such as an optical lens, a film having a polarization function, a film for adjusting a phase difference, and an IR film may be suitably provided by a person who carries out the invention.

Figure 15D:
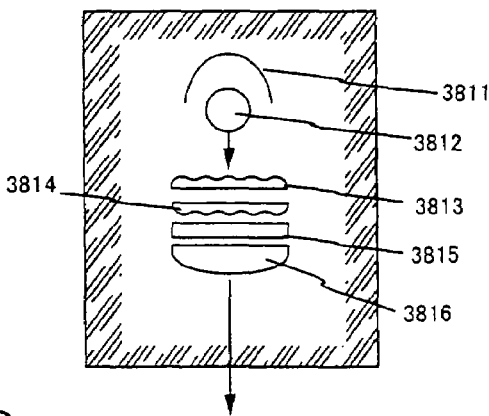

FIG. 15D is a diagram showing an example of the structure of the light source optical system 3801 in FIG. 15C. In this embodiment, the light source optical system 3801 comprises a reflector 3811, alight source 3812, lens arrays 3813, 3814, a polarization conversion element 3815, and a condenser lens 3816. The light source optical system shown in FIG. 15D is merely an example, and is not particularly limited to the illustrated structure. For example, a person who carries out the invention is allowed to suitably add to the light source optical system an optical system such as an optical lens, a film having a polarization function, a film for adjusting a phase difference, and an IR film.

Note that a transmission electro-optical device is used as the projector shown in FIG. 15, a reflection type electro-optical device is not illustrated.

Figure 16A:
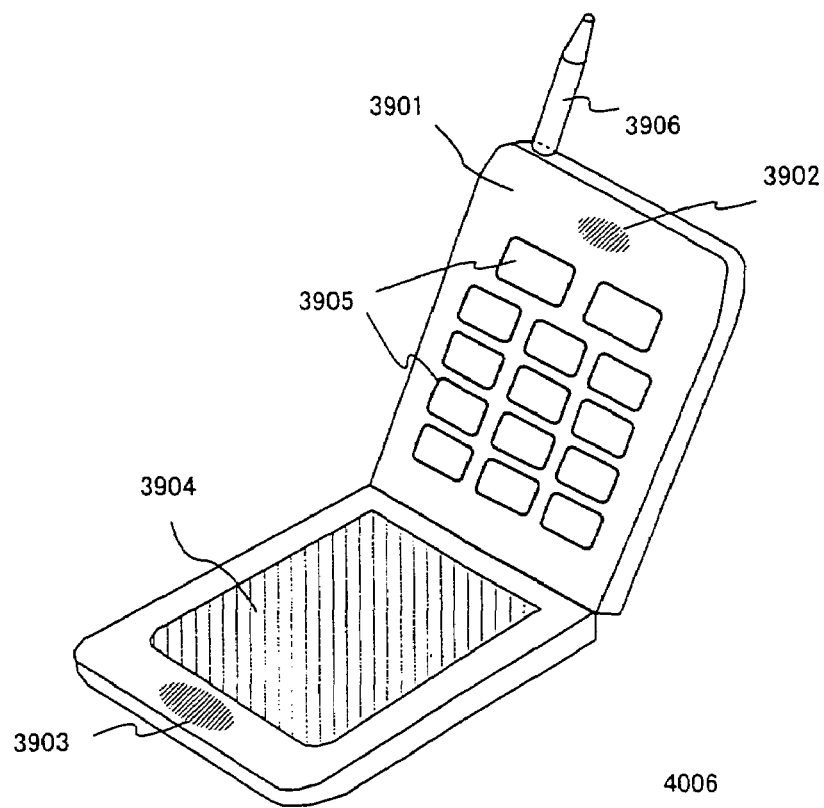
FIGS. 16A to 16C are diagrams showing examples of the semiconductor device.

FIG. 16A is a portable telephone, and it includes a main body 3901, an audio output section 3902, an audio input section 3903, a display portion 3904, operation switches 3905, and an antenna 3906. The present invention can be applied to the audio output portion 3902, the audio input portion 3903, the display portion 3904, and other signal circuit.

Figure 16B:
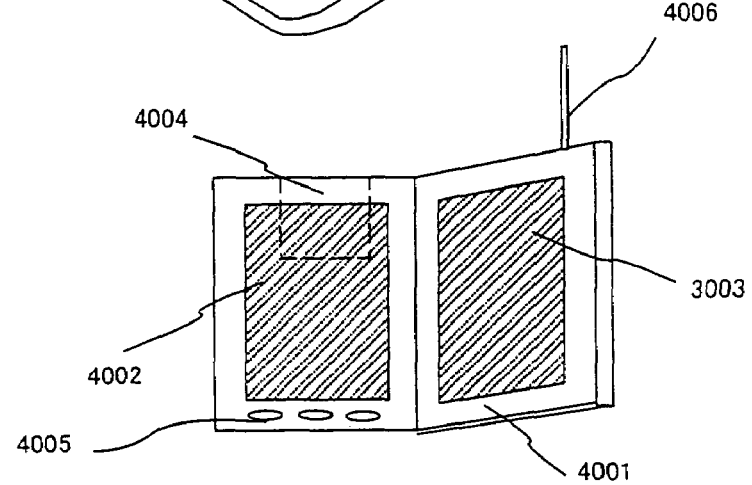

FIG. 16B is a portable book (electronic book), and it includes a main body 4001, display portions 4002 and 4003, a recording medium 4004, operation switches 4005, and an antenna 4006. The present invention can be applied to the display portions 4002 and 4003, and other signal circuit.

Figure 16C:
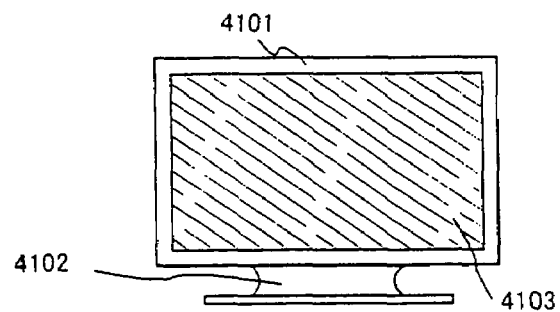

FIG. 16C is a display, and it includes a main body 4101, a support stand 4102, and a display portion 4103. The present invention can be applied to the display portion 4103. The display of the present invention is advantageous for a large size screen in particular, and is advantageous for a display equal to or greater than 10 inches (especially equal to or greater than 30 inches) in diagonal.

The applicable range of the present invention is thus extremely wide, and it is possible to apply the present invention to electronic equipment in all fields. Further, the electronic equipment of the embodiment 10 can be realized by using a constitution of any combination of the embodiments 1 to 9.

The usefulness provided by the structure of the present invention is outlined in the following.

(a) The structure is simple and applicable to existing process of manufacturing a TFT.

(b) There is no need for positioning technique of micron-level precision to position a slit or the like. Nor, a special positioning unit is required in a laser irradiation apparatus. The invention can utilize an ordinary laser irradiation apparatus without any modification.

(c) A TFT can be formed from a semiconductor film without leaving a material that has nothing to do with the function of the TFT in the semiconductor film.

(d) The method according to the present invention is capable of forming crystal grains having a large grain size at designed positions, on top of possessing all of the above advantages (a) through (c). When a crystalline semiconductor film having such crystal grains is used to form a TFT, the obtained TFT can have greatly improved electric characteristics.

What is claimed is:

1. A semiconductor device having a thin film transistor, comprising:
   an insulating film formed on an insulating surface;
   a semiconductor film formed in contact with said insulating film; and
   a channel formation region formed in said semiconductor film and in contact with said insulating film,
   wherein said insulating film has a heat conductivity of 0.3 W/mk or less.

2. A semiconductor device having a thin film transistor, comprising:
   a first insulating film formed on an insulating surface;
   a second insulating film covering said first insulating film;
   a semiconductor film in contact with said second insulating film; and
   a channel formation region formed in said semiconductor film and in contact with said first insulating film via said second insulating film therebetween,
   wherein said first insulating film has a heat conductivity of 0.3 W/mk or less.

3. The semiconductor device according to claim 1 wherein said insulating film comprises silicon oxide, which contains one selected from the group consisting of methyl ($CH_3$) group, ethyl ($C_2H_5$) group, propyl ($C_3H_7$) group, butyl ($C_4H_9$) group, vinyl ($C_2H_3$) group, phenyl ($C_6H_5$) group, and $CF_3$ group.

4. The semiconductor device according to claim 2 wherein said first insulating film comprises silicon oxide, which contains one selected from the group consisting of methyl ($CH_3$) group, ethyl ($C_2H_5$) group, propyl ($C_3H_7$) group, butyl ($C_4H_9$) group, vinyl ($C_2H_3$) group, phenyl ($C_6H_5$) group, and $CF_3$ group.

5. The semiconductor device according to claim 1 wherein said insulating film is selected from the group consisting of a porous silicon film and a porous silicon oxide film.

6. The semiconductor device according to claim 2 wherein said first insulating film is selected from the group consisting of a porous silicon film and a porous silicon oxide film.

7. The semiconductor device according to claim 1 wherein said semiconductor device is selected from the group consisting of a mobile phone, a video camera, a digital camera, a projector, a goggle-type display, a personal computer, a DVD player, an electronic book, and a portable information terminal.

8. The semiconductor device according to claim 2 wherein said semiconductor device is an electroluminescence display device.

9. The semiconductor device according to claim 2 wherein said semiconductor device is selected from the group consisting of a mobile phone, a video camera, a digital camera, a projector, a goggle-type display, a personal computer, a DVD player, an electronic book, and a portable information terminal.

10. The semiconductor device according to claim 1 wherein said semiconductor device is an electroluminescence display device.

11. A semiconductor device having a thin film transistor, comprising:
   a first insulating film formed on an insulating surface;
   a second insulating film covering said first insulating film;
   a semiconductor film in contact with said second insulating film; and
   a channel formation region formed in said semiconductor film and in contact with said first insulating film via said second insulating film therebetween,
   wherein a heat conductivity of said first insulating film is lower than that of said second insulating film.

12. The semiconductor device according to claim 11 wherein said first insulating film comprises silicon oxide, which contains one selected from the group consisting of methyl ($CH_3$) group, ethyl ($C_2H_5$) group, propyl ($C_3H_7$) group, butyl ($C_4H_9$) group,vinyl ($C_2H_3$) group, phenyl ($C_6H_5$) group, and $CF_3$ group.

13. The semiconductor device according to claim 11 wherein said first insulating film is selected from the group consisting of a porous silicon film and a porous silicon oxide film.

14. The semiconductor device according to claim 11 wherein said semiconductor device is selected from the group consisting of a mobile phone, a video camera, a digital camera, a projector, a goggle-type display, a personal computer, a DVD player, an electronic book, and a portable information terminal.

15. The semiconductor device according to claim 11 wherein said semiconductor device is an electroluminescence display device.

\* \* \* \* \*

UNITED STATES PATENT AND TRADEMARK OFFICE
CERTIFICATE OF CORRECTION

PATENT NO. : 7,307,283 B2
APPLICATION NO. : 11/030153
DATED : December 11, 2007
INVENTOR(S) : Satoshi Yoshimoto Page 1 of 1

It is certified that error appears in the above-identified patent and that said Letters Patent is hereby corrected as shown below:

On the Title page of the patent, after item "(62) Division of application No. 09/879,090, filed on Jun. 13, 2001, now Pat. No. 7,078,321.", and before "(51) Int. Cl.", please insert the following:

item -- (30)   Foreign Application Priority Data
    Jun. 19, 2000   (JP) ...................... 2000-182389 --

Signed and Sealed this

Third Day of June, 2008

JON W. DUDAS
*Director of the United States Patent and Trademark Office*